United States Patent
Sakano et al.

(10) Patent No.: US 10,938,388 B2
(45) Date of Patent: Mar. 2, 2021

(54) CONTROL CIRCUIT, SEMICONDUCTOR DEVICE, AND ELECTRICAL CIRCUIT DEVICE

(71) Applicants: Kabushiki Kaisha Toshiba, Minato-ku (JP); Toshiba Electronic Devices & Storage Corporation, Minato-ku (JP)

(72) Inventors: Tatsunori Sakano, Shinagawa (JP); Kazuto Takao, Tsukuba (JP)

(73) Assignees: Kabushiki Kaisha Toshiba, Minato-ku (JP); Toshiba Electronic Devices & Storage Corporation, Minato-ku (JP)

(*) Notice: Subject to any disclaimer, the term of this patent is extended or adjusted under 35 U.S.C. 154(b) by 0 days.

(21) Appl. No.: 16/558,537

(22) Filed: Sep. 3, 2019

(65) Prior Publication Data
US 2020/0220538 A1 Jul. 9, 2020

(30) Foreign Application Priority Data
Jan. 4, 2019 (JP) .............................. JP2019-000102

(51) Int. Cl.
*H03K 17/60* (2006.01)
*H03K 17/567* (2006.01)
*H01L 29/739* (2006.01)
*H03K 17/66* (2006.01)

(52) U.S. Cl.
CPC ....... *H03K 17/567* (2013.01); *H01L 29/7393* (2013.01); *H03K 17/665* (2013.01)

(58) Field of Classification Search
CPC . H03K 17/567; H03K 17/665; H01L 29/7393
USPC .......................................................... 327/478
See application file for complete search history.

(56) References Cited

U.S. PATENT DOCUMENTS

| 9,553,576 | B2* | 1/2017 | Lan ................. H03K 17/14 |
| 9,831,865 | B2 | 11/2017 | Lokrantz et al. |
| 9,997,602 | B2* | 6/2018 | Laven ............. H01L 29/42368 |
| 2016/0020763 | A1* | 1/2016 | Osanai ............. H03K 17/567 327/108 |
| 2016/0190123 | A1 | 6/2016 | Laven et al. |

FOREIGN PATENT DOCUMENTS

| JP | 2011-082764 A | 4/2011 |
| JP | 2013-098336 A | 5/2013 |
| JP | 2016-522661 A | 7/2016 |
| JP | 6080938 B2 | 2/2017 |

* cited by examiner

*Primary Examiner* — Metasebia T Retebo
(74) *Attorney, Agent, or Firm* — Oblon, McClelland, Maier & Neustadt, L.L.P.

(57) ABSTRACT

According to one embodiment, a control circuit is connected to an element portion including a first element. The first element includes a first gate, a first collector, and a first emitter. The control circuit performs a first operation and a second operation. In at least a portion of the first operation, the control circuit causes a first current to flow from the first collector toward the first emitter. In at least a portion of the second operation, the control circuit causes a second current to flow from the first emitter toward the first collector. A first time constant of a switching of the first element in the first operation is different from a second time constant of a switching of the first element in the second operation.

18 Claims, 12 Drawing Sheets

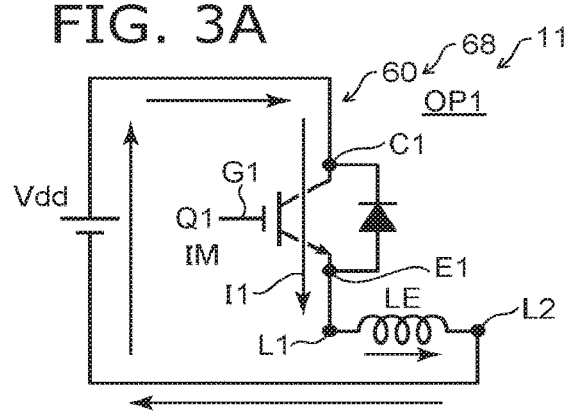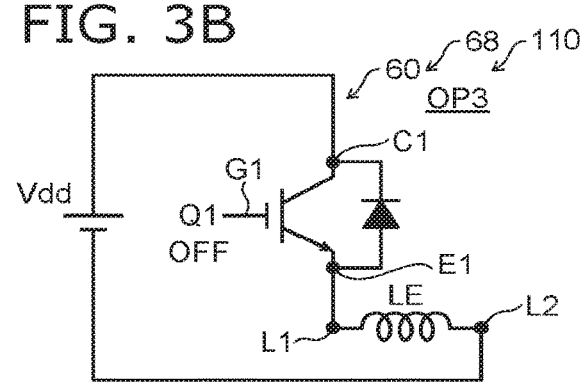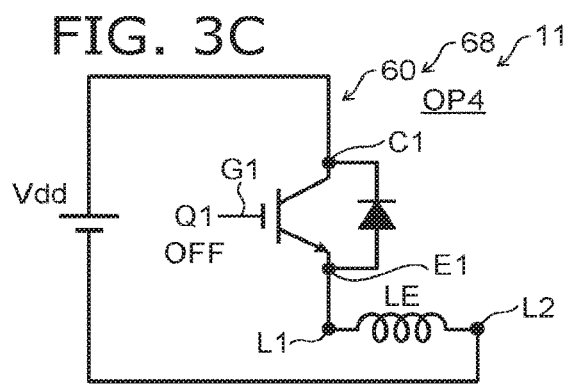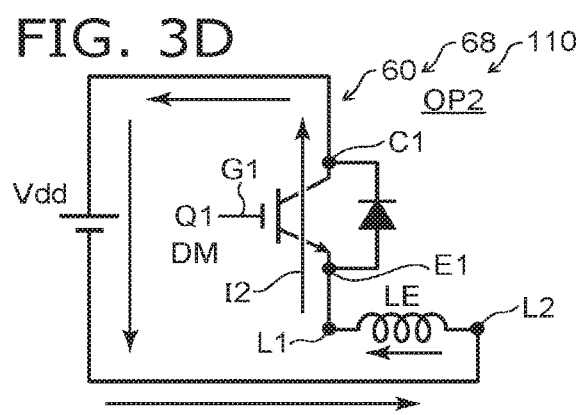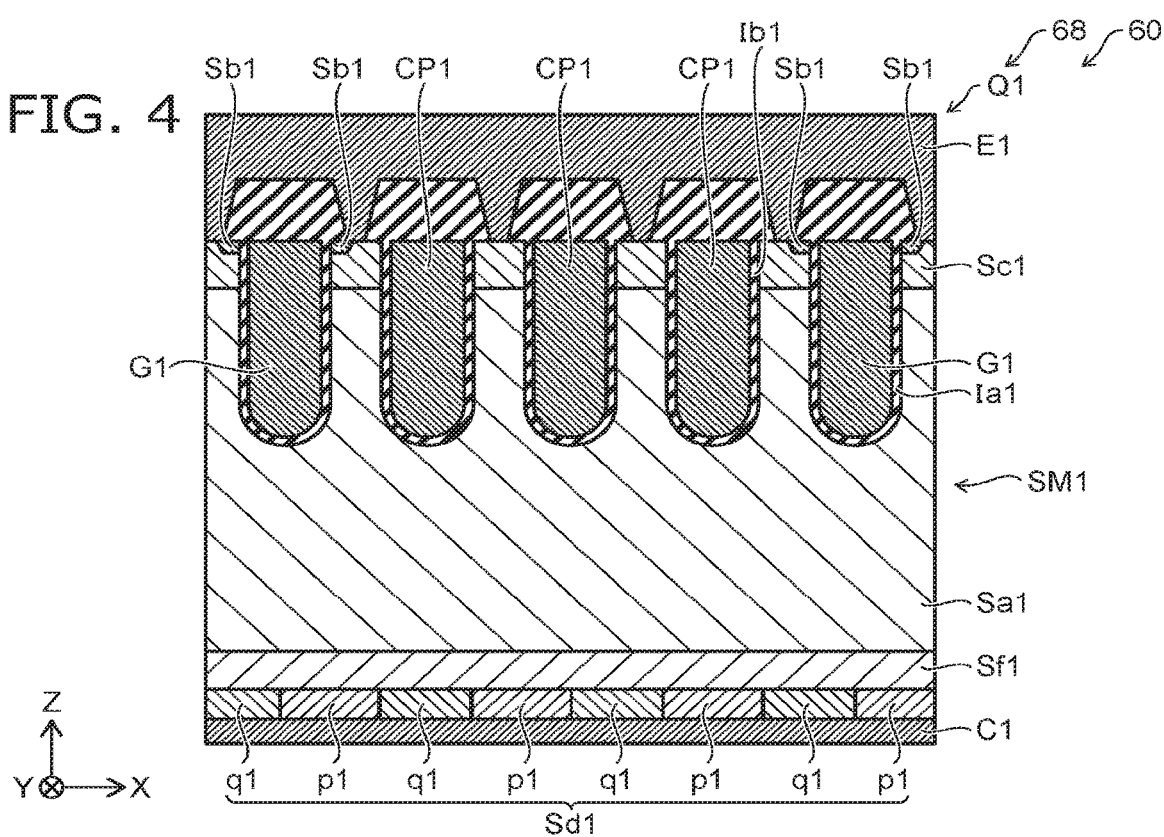

CONTROL CIRCUIT, SEMICONDUCTOR DEVICE, AND ELECTRICAL CIRCUIT DEVICE

CROSS-REFERENCE TO RELATED APPLICATIONS

This application is based upon and claims the benefit of priority from Japanese Patent Application No. 2019-000102, filed on Jan. 4, 2019; the entire contents of which are incorporated herein by reference.

FIELD

Embodiments described herein relate generally to a control circuit, a semiconductor device, and an electrical circuit device.

BACKGROUND

For example, a semiconductor device such as an IGBT (insulated gate bipolar transistor) or the like is used in a power conversion circuit, etc. A control circuit and an electrical circuit that can suppress the loss of the semiconductor device are desirable.

BRIEF DESCRIPTION OF THE DRAWINGS

FIG. 3A to FIG. 3D are schematic views illustrating the operation of the control circuit, the semiconductor device, and the electrical circuit device according to the first embodiment;

FIG. 4 is a schematic cross-sectional view illustrating the semiconductor device according to the first embodiment;

DETAILED DESCRIPTION

Figure 1A:
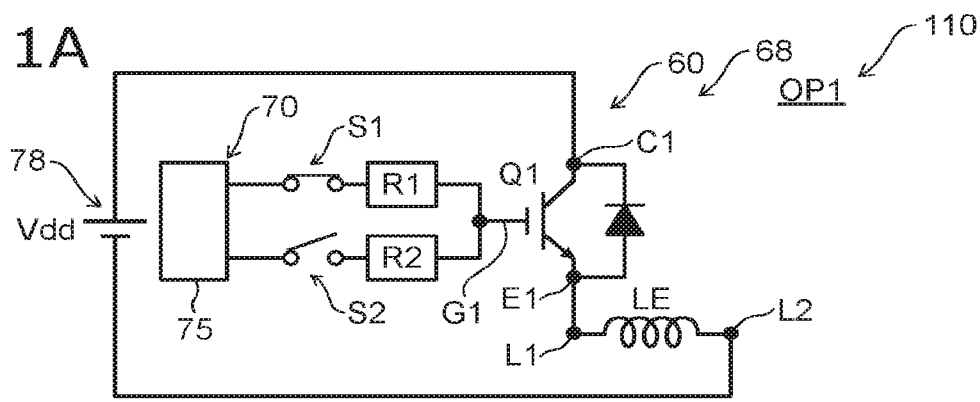
FIG. 1A and FIG. 1B are schematic views illustrating a control circuit, a semiconductor device, and an electrical circuit device according to a first embodiment.

According to one embodiment, a control circuit is connected to an element portion including a first element. The first element includes a first gate, a first collector, and a first emitter. The control circuit is configured to perform a first operation and a second operation. In at least a portion of the first operation, the control circuit causes a first current to flow from the first collector toward the first emitter. In at least a portion of the second operation, the control circuit causes a second current to flow from the first emitter toward the first collector. A first time constant of a switching of the first element in the first operation is different from a second time constant of a switching of the first element in the second operation.

According to one embodiment, a semiconductor device includes an element portion. The element portion includes a first element, a first resistance, and a second resistance lower than the first resistance. The first element includes a first gate, a first collector, a first emitter, a semiconductor portion, a conductive portion, a first insulating region, and a second insulating region. The semiconductor portion includes a first semiconductor region, a second semiconductor region, a third semiconductor region, and a fourth semiconductor region. The first semiconductor region is provided between the first collector and the first emitter in a first direction. The first direction is from the first collector toward the first emitter. The first semiconductor region is of a first conductivity type. The second semiconductor region is provided between the first semiconductor region and the first emitter and electrically connected to the first emitter. The second semiconductor region is of the first conductivity type. The third semiconductor region is provided between the first semiconductor region and the second semiconductor region in the first direction. The third semiconductor region is of a second conductivity type. The fourth semiconductor region is provided between the first semiconductor region and the first collector. The fourth semiconductor region includes a plurality of first partial regions and a plurality of second partial regions. The plurality of first partial regions is of the first conductivity type. The plurality of second partial regions is of the second conductivity type. The plurality of first partial regions and the plurality of second partial regions are provided alternately in a direction crossing the first direction. A direction from the first gate toward a portion of the first semiconductor region and a direction from the first gate toward the third semiconductor region are aligned with a second direction crossing the first direction. A direction from the conductive portion toward a portion of the first semiconductor region and a direction from the conductive portion toward the third semiconductor region are aligned with the second direction. The first insulating region is provided between the first gate and the semiconductor portion and between the first gate and the first emitter. The second insulating region is provided between the conductive portion and the semiconductor portion and between the conductive portion and the first emitter. The first resistance is electrically connected to the first gate. The second resistance is electrically connected to the first gate.

According to another embodiment, an electrical circuit device includes the control circuit described above and a semiconductor device including the element portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
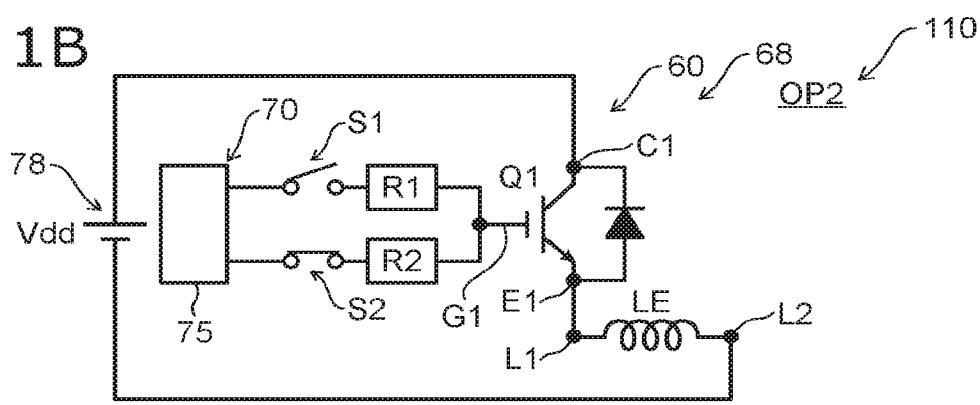

FIG. 1A and FIG. 1B are schematic views illustrating a control circuit, a semiconductor device, and an electrical circuit device according to a first embodiment.

The electrical circuit device 110 according to the embodiment includes the semiconductor device 68 and the control circuit 70. The electrical circuit device 110 may further include a power supply 78.

The semiconductor device 68 includes an element portion 60. The element portion 60 includes a first element Q1.

The first element Q1 includes a first gate G1, a first collector C1, and a first emitter E1. The first element Q1 is, for example, an RC-IGBT (reverse-conducting insulated gate bipolar transistor). Examples of the structure of the first element Q1 are described below.

For example, a load LE is connected to the semiconductor device 68 of the electrical circuit device 110. For example, a first end portion L1 of the load LE is electrically connected to the first emitter E1. For example, the first collector C1 and a second end portion L2 of the load LE are connected to the power supply 78. For example, the power supply 78 applies a voltage Vdd between the second end portion L2 and the first collector C1. For example, the power supply 78 supplies electrical power to the element portion 60.

The control circuit 70 is connected to the element portion 60. For example, the control circuit 70 controls the potential of the first gate G1. The first element Q1 performs a switching operation thereby.

In the example, the element portion 60 includes a first resistance R1 and a second resistance R2. These resistances can be electrically connected to the first gate G1. The resistance value of the second resistance R2 is different from the resistance value of the first resistance R1. In an example described below, the second resistance R2 is lower than the first resistance R1.

The control circuit 70 performs a first operation OP1 and a second operation OP2. FIG. 1A corresponds to the first operation OP1. FIG. 1B corresponds to the second operation OP2.

As shown in FIG. 1A, in the first operation OP1, the control circuit 70 is electrically connected to the first gate G1 via the first resistance R1. In the second operation OP2, the control circuit 70 is electrically connected to the first gate G1 via the second resistance R2.

For example, the control circuit 70 includes a first switch S1 and a second switch S2. One end of the first switch S1 is electrically connected to the first resistance R1. Another end of the first switch S1 is electrically connected to a controller 75 of the control circuit 70. One end of the second switch S2 is electrically connected to the second resistance R2. Another end of the second switch S2 is electrically connected to the controller 75 of the control circuit 70. The control circuit 70 may include the controller 75, the first switch S1, and the second switch S2. The first switch S1 is provided in a path between the controller 75 and the first resistance R1. The second switch S2 is provided in a path between the controller 75 and the second resistance R2.

In the first operation OP1 as shown in FIG. 1A, the first switch S1 is in the ON-state; and the second switch S2 is in the OFF-state. Thereby, the controller 75 (the control circuit 70) is electrically connected to the first gate G1 via the first resistance R1.

In the second operation OP2 as shown in FIG. 1B, the first switch S1 is in the OFF-state; and the second switch S2 is in the ON-state. Thereby, the controller 75 (the control circuit 70) is electrically connected to the first gate G1 via the second resistance R2.

Because the first resistance R1 and the second resistance R2 are different from each other, the switching characteristics of the first element Q1 are different. For example, the time constant of the switching is different between the first operation OP1 and the second operation OP2.

Figure 2A:
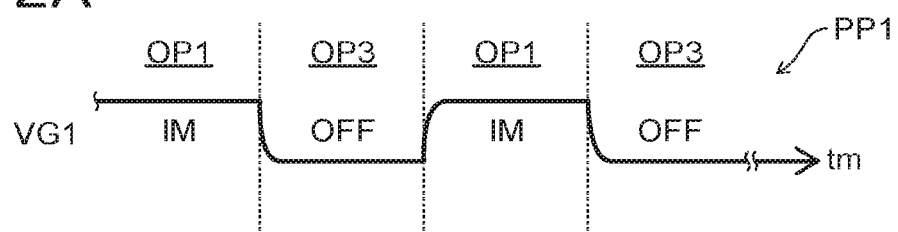
FIG. 2A and FIG. 2B are schematic views illustrating the operation of the control circuit, the semiconductor device, and the electrical circuit device according to the first embodiment.
Figure 2B:
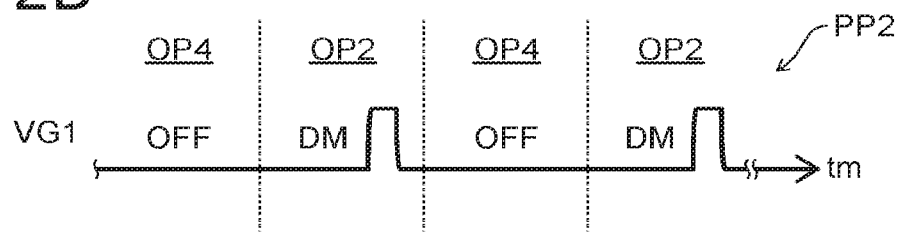

FIG. 2A and FIG. 2B are schematic views illustrating the operation of the control circuit, the semiconductor device, and the electrical circuit device according to the first embodiment.

In these drawings, the horizontal axis is a time tm. In these drawings, the vertical axis is a voltage (a first gate voltage VG1) of the first gate G1.

In an example described below, the control circuit 70 performs a first polar operation PP1 including the first operation OP1, and a second polar operation PP2 including the second operation OP2.

In the first polar operation PP1, the first operation OP1 and a third operation OP3 are repeatedly performed alternately. In the first operation OP1, the first element Q1 is in an IGBT mode IM. In the third operation OP3, the first element Q1 is OFF.

In the second polar operation PP2, the second operation OP2 and a fourth operation OP4 are repeatedly performed alternately. In the second operation OP2, the first element Q1 is in a diode mode DM. In the fourth operation OP4, the first element Q1 is OFF.

Examples of the currents in these operations are described below.

As shown in FIG. 2A, the time constant is long when the IGBT mode IM is switched OFF and when the OFF-state is switched to the IGBT mode IM. The first gate voltage VG1 changes gradually.

On the other hand, as shown in FIG. 2B, the time constant is short for the rise and the fall of the first gate voltage VG1 in the diode mode DM.

Thus, in the embodiment, a first time constant of the switching of the first element Q1 in the first operation OP1 (referring to FIG. 2A) is different from a second time constant of the switching of the first element Q1 in the second operation OP2 (referring to FIG. 2B).

For example, the second resistance R2 is lower than the first resistance R1. In such a case, the second time constant is shorter than the first time constant.

FIG. 3A to FIG. 3D are schematic views illustrating the operation of the control circuit, the semiconductor device, and the electrical circuit device according to the first embodiment.

FIG. 3A to FIG. 3D correspond respectively to the first operation OP1, the third operation OP3, the fourth operation OP4, and the second operation OP2. The control circuit 70, the first resistance R1, the second resistance R2, the first switch S1, the second switch S2, etc., are not illustrated in these drawings.

In at least a portion of the first operation OP1 as shown in FIG. 3A, the control circuit 70 causes a first current I1 to flow from the first collector C1 toward the first emitter E1. The first current I1 flows from the first end portion L1 of the load LE toward the second end portion L2.

In at least a portion of the second operation OP2 as shown in FIG. 3D, the control circuit 70 causes a second current I2 to flow from the first emitter E1 toward the first collector C1. The second current I2 flows from the second end portion L2 of the load LE toward the first end portion L1.

In the third operation OP3 and the fourth operation OP4 as shown in FIG. 3B and FIG. 3C, the control circuit 70 sets the first element Q1 to the OFF-state.

As described in reference to FIG. 2A and FIG. 2B, the first time constant of the switching of the first element Q1 in the first operation OP1 is different from the second time constant of the switching of the first element Q1 in the second operation OP2. The second time constant is shorter than the first time constant. Thereby, as described below, the loss can be suppressed.

In the second operation OP2 (referring to FIG. 3D), the first element Q1 is in the diode mode DM. In the diode mode DM, the carrier concentration in the semiconductor layer of the first element Q1 is high when the voltage of the first gate G1 is low (e.g., when the gate voltage is −15 V). The conduction loss is small; and the recovery loss is large. In the diode mode DM, the carrier concentration in the semiconductor layer of the first element Q1 is low when the voltage of the first gate G1 is high (e.g., when the gate voltage is +15 V). The conduction loss is large; and the recovery loss is small.

For example, as shown in FIG. 2B, a period in which the voltage of the first gate G1 is low and a period in which the voltage of the first gate G1 is high are provided in one period of the second operation OP2 (the diode mode DM). For example, the conduction loss can be reduced by lengthening the period in which the voltage of the first gate G1 is low. Also, the recovery loss can be reduced while suppressing the increase of the conduction loss by shortening the period in which the voltage of the first gate G1 is high.

In the diode mode DM, it is favorable for the switching time of the first gate G1 to be small. Thereby, for example, an unintentional increase of the carrier concentration partway through the switching can be suppressed. The switching time is, for example, the switching time from the state in which the voltage of the first gate G1 is low to the state in which the voltage of the first gate G1 is high, or the switching time from the state in which the voltage of the first gate G1 is high to the state in which the voltage of the first gate G1 is low.

For example, by reducing the gate resistance, the switching time of the diode mode DM can be shortened. However, when the switching time is shortened, it is easy for the switching of the IGBT mode IM to become excessively fast and for the element to breakdown. Therefore, in the IGBT mode IM, it is difficult to sufficiently shorten the switching time.

In the embodiment, multiple switching times (time constants) are provided in the first element Q1. For example, the first time constant of the switching of the first element Q1 in the first operation OP1 (the IGBT mode IM) (referring to FIG. 2A) is longer than the second time constant of the switching of the first element Q1 in the second operation OP2 (the diode mode DM) (referring to FIG. 2B). In other words, the second time constant is shorter than the first time constant.

Thereby, in the diode mode DM, the recovery loss can be reduced while suppressing the increase of the conduction loss. Also, the breakdown of the element in the IGBT mode IM is suppressed. In the embodiment, a control circuit, a semiconductor device, and an electrical circuit device can be provided in which the loss can be suppressed.

For example, the difference between the first time constant and the second time constant is obtained by the difference between the first resistance R1 and the second resistance R2. In the embodiment, the time constant can be changed by modifying at least one of the electrical resistance, the electrical capacitance, or the inductance of the current path including the first gate G1 between the first operation OP1 and the second operation OP2.

For example, the ratio of the absolute value of the difference between the first resistance R1 and the second resistance R2 to the second resistance R2 is 0.01 or more. In the embodiment, the ratio may be 0.05 or more. The ratio may be 0.1 or more. When the ratio is high, the difference between the time constants of the first operation OP1 and the second operation OP2 becomes large.

In the embodiment, the difference between the first resistance R1 and the second resistance R2 is larger than the resistance difference caused by the fluctuation of the resistance elements.

An example of the first element Q1 will now be described.

FIG. 4 is a schematic cross-sectional view illustrating the semiconductor device according to the first embodiment.

As shown in FIG. 4, the semiconductor device 68 includes the element portion 60. The element portion 60 includes the first element Q1. The first element Q1 includes a semiconductor portion SM1, a conductive portion CP1, a first insulating region Ia1, and a second insulating region Ib1 in addition to the first gate G1, the first collector C1, and the first emitter E1.

The semiconductor portion SM1 includes a first semiconductor region Sa1, a second semiconductor region Sb1, a third semiconductor region Sc1, and a fourth semiconductor region Sd1.

The first semiconductor region Sa1 is provided between the first collector C1 and the first emitter E1 in a first direction which is from the first collector C1 toward the first emitter E1. The first semiconductor region Sa1 is of a first conductivity type.

The first direction is taken as a Z-axis direction. One direction perpendicular to the Z-axis direction is taken as an X-axis direction. A direction perpendicular to the Z-axis direction and the X-axis direction is taken as a Y-axis direction.

The second semiconductor region Sb1 is electrically connected to the first emitter E1. The second semiconductor region Sb1 is of the first conductivity type.

A portion of the third semiconductor region Sc1 is provided between the first semiconductor region Sa1 and the second semiconductor region Sb1 in the first direction (the Z-axis direction). The third semiconductor region Sc1 is of a second conductivity type.

The first conductivity type is one of an n-type or a p-type. The second conductivity type is the other of the n-type or the p-type. Hereinbelow, the first conductivity type is taken to be the n-type; and the second conductivity type is taken to be the p-type.

The fourth semiconductor region Sd1 is provided between the first semiconductor region Sa1 and the first collector C1. The fourth semiconductor region Sd1 includes multiple first partial regions p1 of the first conductivity type and multiple second partial regions q1 of the second conductivity type. The multiple first partial regions p1 and the multiple second partial regions q1 are provided alternately in a direction crossing the first direction. A second direction that crosses the first direction is, for example, the X-axis direction. The direction that crosses the first direction may be any direction in the X-Y plane.

A portion of the first semiconductor region Sa1 is between the first gate G1 and the fourth semiconductor region Sd1 in the first direction (the Z-axis direction). The direction from the first gate G1 toward the third semiconductor region Sc1 is aligned with the second direction (e.g., the X-axis direction) crossing the first direction. The direction from the bottom portion of the first gate G1 toward a portion of the first semiconductor region Sa1 is aligned with the second direction (e.g., the X-axis direction).

Another portion of the first semiconductor region Sa1 is between the conductive portion CP1 and the fourth semiconductor region Sd1 in the first direction (the Z-axis direction). The direction from the conductive portion CP1 toward the third semiconductor region Sc1 is aligned with the second direction (e.g., the X-axis direction).

The first insulating region Ia1 is provided between the first gate G1 and the semiconductor portion SM1 and between the first gate G1 and the first emitter E1. The first insulating region Ia1 insulates the first gate G1 and the semiconductor portion SM1 from each other. The first insulating region Ia1 insulates the first gate G1 and the first emitter E1 from each other.

The second insulating region Ib1 is provided between the conductive portion CP1 and the semiconductor portion SM1 and between the conductive portion CP1 and the first emitter E1. The second insulating region Ib1 insulates the conductive portion CP1 and the semiconductor portion SM1 from each other. The second insulating region Ib1 insulates the conductive portion CP1 and the first emitter E1 from each other.

A RC-IGBT is obtained from such a structure. For example, the conductive portion CP1 is electrically connected to the first emitter E1. The connection may be performed via a conductive member of a mounting substrate, etc. As recited above, a portion of the third semiconductor region Sc1 is provided between the first semiconductor region Sa1 and the second semiconductor region Sb1 in the first direction (the Z-axis direction). Another portion of the third semiconductor region Sc1 is not between the first semiconductor region Sa1 and the second semiconductor region Sb1 in the Z-axis direction. The second semiconductor region Sb1 is not provided on the other portion of the third semiconductor region Sc1. The second insulating region Ib1 contacts the conductive portion CP1 and the other portion of the third semiconductor region Sc1.

In the example, the semiconductor portion SM1 further includes a semiconductor region Sf1.

The semiconductor region Sf1 is provided between the fourth semiconductor region Sd1 and the first semiconductor region Sa1 in the first direction (the Z-axis direction). The semiconductor region Sf1 is of the first conductivity type (e.g., the n-type).

In one example, the impurity concentration of the second conductivity type in the multiple second partial regions q1 is higher than the impurity concentration of the second conductivity type in the third semiconductor region Sc1. The multiple second partial regions q1 are, for example, $p^+$-layers; and the third semiconductor region Sc1 is a p-layer.

In one example, the impurity concentration of the first conductivity type in the semiconductor region Sf1 is between the impurity concentration of the first conductivity type in the first partial regions p1 and the impurity concentration of the first conductivity type in the first semiconductor region Sa1. For example, the first semiconductor region Sa1 is an $n^-$-layer. The second semiconductor region Sb1 is an $n^+$-layer. The first partial regions p1 are, for example, $n^+$-layers. The semiconductor region Sf1 is an n-layer.

The first semiconductor region Sa1 is, for example, a drift region. The second semiconductor region Sb1 is, for example, a source contact region. The third semiconductor region Sc1 is, for example, a body region. The semiconductor region Sf1 is a field stop region.

Figure 5:
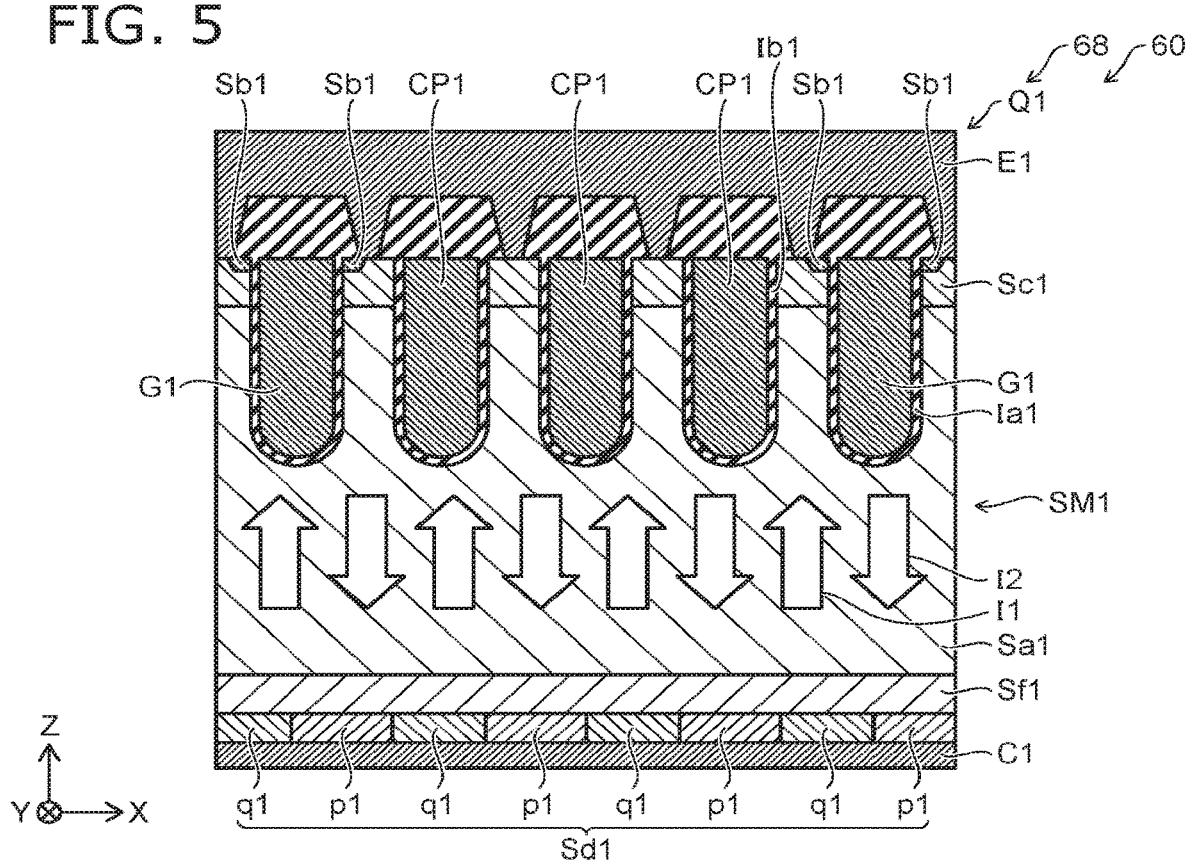
FIG. 5 is a schematic cross-sectional view illustrating the operation of the semiconductor device according to the first embodiment.

FIG. 5 is a schematic cross-sectional view illustrating the operation of the semiconductor device according to the first embodiment.

In the first element Q1 included in the semiconductor device 68 as shown in FIG. 5, the first current I1 flows in the first operation OP1 (referring to FIG. 3A). The first current I1 has an orientation from the first collector C1 toward the first emitter E1. The second current I2 flows in the second operation OP2 (referring to FIG. 3D). The second current I2 has an orientation from the first emitter E1 toward the first collector C1.

As described above, in the second operation OP2 (the state in which the second current I2 flows), the carrier state (the carrier concentration) can be changed by the potential of the first gate G1.

In an RC-IGBT, the carrier state (the carrier concentration) in the diode mode DM can be controlled by the potential of the first gate G1. On the other hand, in a configuration in which an IGBT and a FWD (Free Wheeling Diode) are connected in anti-parallel in separate chips, the gate of the IGBT is separated from the FWD; therefore, the potential of the gate is not affected by the carrier state of the FWD. Therefore, in this configuration, the carrier state (the carrier concentration) cannot be controlled by the potential of the first gate G1.

Figure 6A:
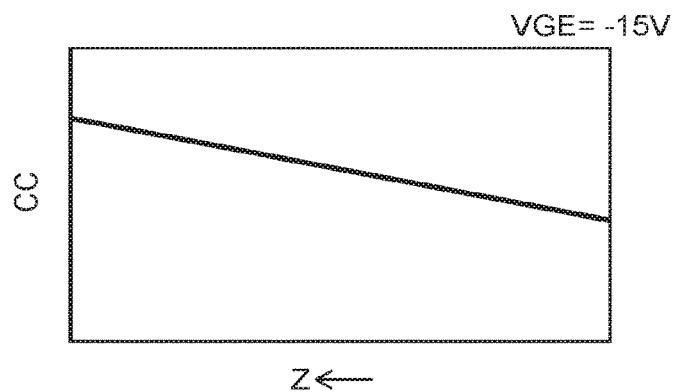
FIG. 6A and FIG. 6B are graphs illustrating characteristics of the semiconductor device according to the first embodiment.
Figure 6B:
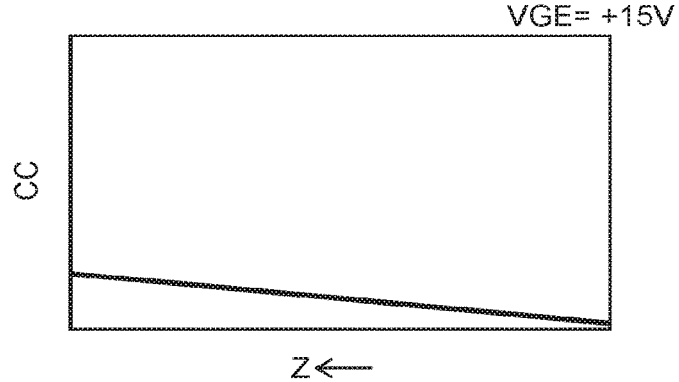

FIG. 6A and FIG. 6B are graphs illustrating characteristics of the semiconductor device according to the first embodiment.

These drawings illustrate simulation results of the carrier concentration in the diode mode DM. FIG. 6A corresponds to the first gate G1 in the OFF-state. In the example, a potential VGE of the first gate G1 in the OFF-state is −15 V. FIG. 6B corresponds to when the first gate G1 is ON. In the example, the potential VGE of the first gate G1 in the ON-state is +15 V. In these drawings, the horizontal axis is the position in the thickness direction of the semiconductor portion SM1 (the Z-axis direction). The vertical axis is a carrier concentration CC.

As shown in FIG. 6A, the carrier concentration CC is high when the first gate G1 is in the OFF-state. As described above, in such a case, the conduction loss is small; and the recovery loss is large.

When the first gate G1 is in the ON-state as shown in FIG. 6B, the carrier concentration CC is low compared to the case of FIG. 6A. As described above, in such a case, the conduction loss is large; and the recovery loss is small.

When performing the first operation OP1 and the second operation OP2 in the first element Q1 having such special characteristics in the embodiment as recited above, the time constant in the second operation OP2 is set to be shorter than the time constant in the first operation OP1. Thereby, in the diode mode DM, the recovery loss can be reduced while suppressing the increase of the conduction loss. The breakdown of the element in the IGBT mode IM is suppressed. In the embodiment, a control circuit, a semiconductor device, and an electrical circuit device can be provided in which the loss can be suppressed.

Second Embodiment

FIG. 7A to FIG. 7D are schematic views illustrating a control circuit, a semiconductor device, and an electrical circuit device according to a second embodiment.

The electrical circuit device 120 according to the embodiment includes the semiconductor device 68 and the control circuit 70. The electrical circuit device 120 may further include the power supply 78. These drawings correspond to the first to fourth operations OP1 to OP4 performed by the control circuit 70. In the example as shown in these drawings, the element portion 60 that is included in the semiconductor device 68 further includes a second element Q2 in addition to the first element Q1.

The second element Q2 includes a second gate G2, a second collector C2, and a second emitter E2. The first emitter E1 of the first element Q1 is electrically connected to the second collector C2. The first emitter E1 is electrically connected to the first end portion L1 of the load LE. The voltage Vdd is applied between the first collector C1 and the second end portion L2 of the load. A voltage Vss is applied between the second end portion L2 and the second emitter E2. For example, the voltage Vdd and the voltage Vss are supplied by the power supply 78.

In the example, the first resistance R1 and the second resistance R2 are connected to the first gate G1. On the other hand, a third resistance R3 and a fourth resistance R4 are connected to the second gate G2. The second resistance R2 is lower than the first resistance R1. The fourth resistance R4 is lower than the third resistance R3.

Figure 7A:
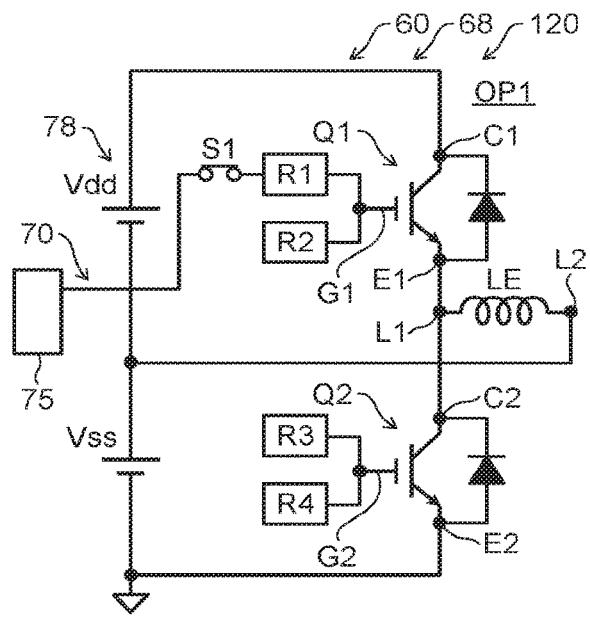
FIG. 7A to FIG. 7D are schematic views illustrating a control circuit, a semiconductor device, and an electrical circuit device according to a second embodiment.
Figure 7B:
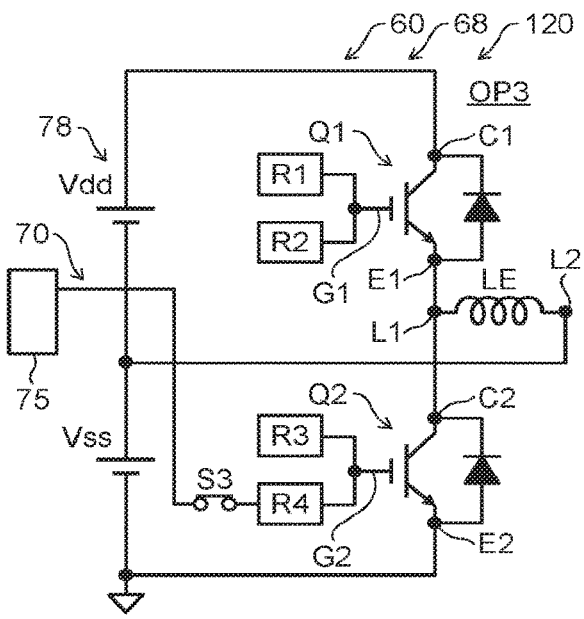
Figure 7C:
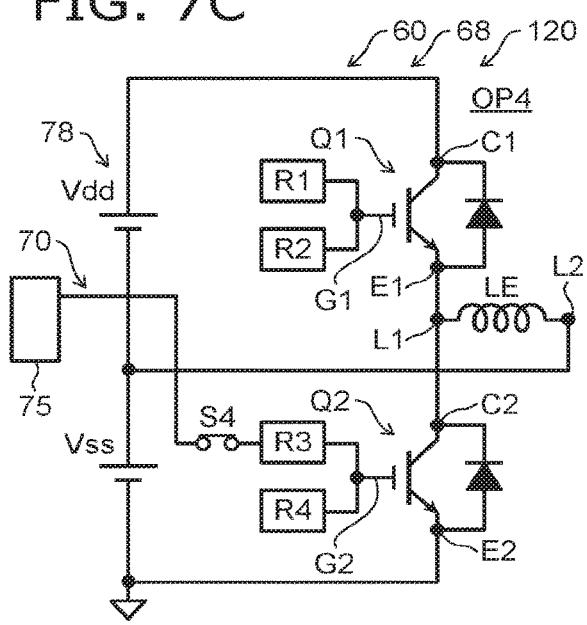
Figure 7D:
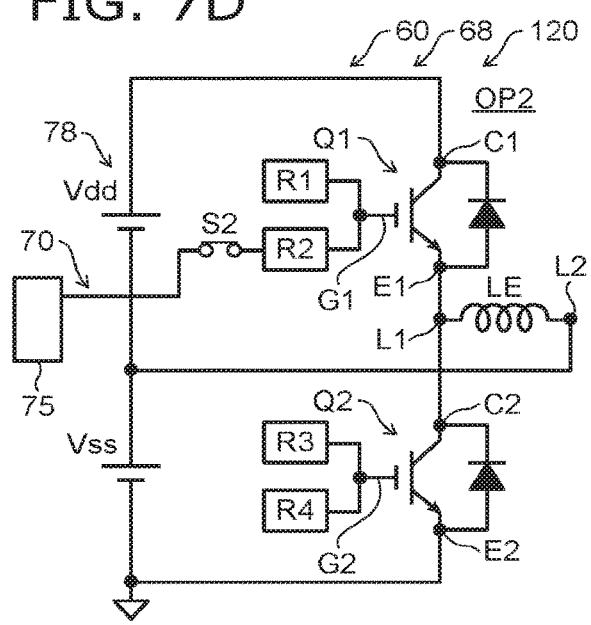

In the first operation OP1 as shown in FIG. 7A, the first resistance R1 and the controller 75 of the control circuit 70 are electrically connected by the first switch S1. In the second operation OP2 as shown in FIG. 7D, the second resistance R2 and the controller 75 of the control circuit 70 are electrically connected by the second switch S2. In the third operation OP3 as shown in FIG. 7B, the fourth resistance R4 and the controller 75 of the control circuit 70 are electrically connected by a third switch S3. In the fourth operation OP4 as shown in FIG. 7C, the third resistance R3 and the controller 75 of the control circuit 70 are electrically connected by a fourth switch S4. These switches may be included in the control circuit 70.

Thus, in the first operation OP1, the control circuit 70 is connected to the first gate G1 via the first resistance R1. In the second operation OP2, the control circuit 70 is connected to the first gate G1 via the second resistance R2. In the third operation OP3, the control circuit 70 is connected to the second gate G2 via the fourth resistance R4. In the fourth operation OP4, the control circuit 70 is connected to the second gate G2 via the third resistance R3.

Different time constants are obtained in the different operations by providing different resistances between the controller 75 and the gates in the different operations.

Figure 8A:
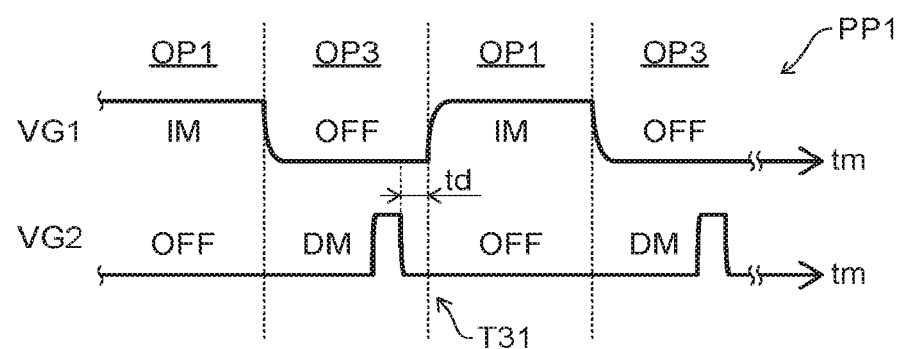
FIG. 8A and FIG. 8B are schematic views illustrating the operation of the control circuit, the semiconductor device, and the electrical circuit device according to the second embodiment.
Figure 8B:
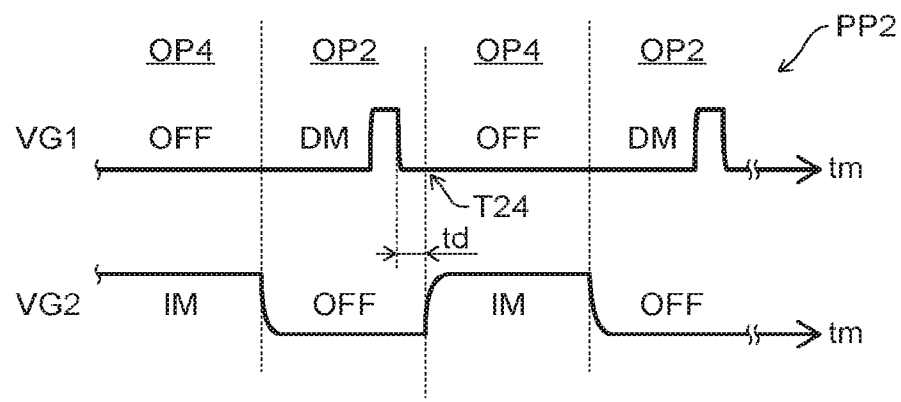

FIG. 8A and FIG. 8B are schematic views illustrating the operation of the control circuit, the semiconductor device, and the electrical circuit device according to the second embodiment.

These drawings show the voltage (the first gate voltage VG1) of the first gate G1 and the voltage (a second gate voltage VG2) of the second gate G2. In these drawings, the horizontal axis is the time tm. In these drawings, the vertical axis is the first gate voltage VG1 or the second gate voltage VG2.

In an example described below, the control circuit 70 performs the first polar operation PP1 including the first operation OP1 and the third operation OP3, and the second polar operation PP2 including the second operation OP2 and the fourth operation OP4.

In the first polar operation PP1, the first operation OP1 and the third operation OP3 are repeatedly performed alternately. In the first operation OP1, the first element Q1 is in the IGBT mode IM; and the second element Q2 is OFF. In the third operation OP3, the first element Q1 is OFF; and the second element Q2 is in the diode mode DM.

In the second polar operation PP2, the second operation OP2 and the fourth operation OP4 are repeatedly performed alternately. In the second operation OP2, the first element Q1 is in the diode mode DM; and the second element Q2 is OFF. In the fourth operation OP4, the first element Q1 is OFF; and the second element Q2 is in the IGBT mode IM.

Thus, in the first operation OP1 and the second operation OP2, the control circuit 70 sets the second element Q2 to the OFF-state. In the third operation OP3 and the fourth operation OP4, the control circuit 70 sets the first element Q1 to the OFF-state.

As shown in FIG. 8A and FIG. 8B, the first time constant of the switching of the first element Q1 in the first operation OP1 is different from the second time constant of the switching of the first element Q1 in the second operation OP2. The second time constant (the time constant in the diode mode DM) is shorter than the first time constant (the time constant in the IGBT mode IM).

As shown in FIG. 8A and FIG. 8B, the third time constant of the switching of the second element Q2 in the third operation OP3 is different from the fourth time constant of the switching of the second element Q2 in the fourth operation OP4. The third time constant (the time constant in the diode mode DM) is shorter than the fourth time constant (the time constant in the IGBT mode IM).

For example, as shown in FIG. 8B, the pulse of the first element Q1 in the second operation OP2 ends before the time (a transition timing T24) of the transition from the second operation OP2 to the fourth operation OP4. Thereby, the first element Q1 and the second element Q2 are suppressed from being ON simultaneously.

As described above, in the diode mode DM, the carrier concentration in the semiconductor layer of the first element Q1 is high when the voltage of the first gate G1 is low (e.g., when the first gate voltage VG1 is −15 V). In such a case, the conduction loss is small; and the recovery loss is large. In the diode mode DM, the carrier concentration in the semiconductor layer of the first element Q1 is low when the first gate voltage VG1 is high (e.g., when the gate voltage is +15 V). In such a case, the conduction loss is large; and the recovery loss is small.

If a period td from the end of the pulse of the first element Q1 to the transition timing T24 (referring to FIG. 8B) is long, the carrier concentration undesirably returns to the original concentration during the period td and is high. Therefore, the recovery loss is large.

In the embodiment, the second time constant in the second operation OP2 (when the first element Q1 is in the diode mode DM) is set to be short. The pulse of the second operation OP2 can approach the transition timing T24 thereby. A high carrier concentration can be suppressed thereby. Thereby, in the first element Q1, the recovery loss can be reduced.

On the other hand, the first time constant in the first operation OP1 (when the first element Q1 is in the IGBT mode IM) is long; therefore, the breakdown of the first element Q1 can be suppressed.

Similarly, for example, as shown in FIG. 8A, the pulse of the second element Q2 in the third operation OP3 ends before the time (a transition timing T31) of the transition from the third operation OP3 to the first operation OP1. Thereby, the first element Q1 and the second element Q2 are suppressed from being ON simultaneously.

In the embodiment, the third time constant in the third operation OP3 (when the second element Q2 is in the diode mode DM) is set to be short. Thereby, the pulse in the third operation OP3 can approach the transition timing T31. A high carrier concentration can be suppressed thereby. Thereby, in the second element Q2, the recovery loss can be reduced.

FIG. 9A to FIG. 9D are schematic views illustrating the operation of the control circuit, the semiconductor device, and the electrical circuit device according to the second embodiment.

FIG. 9A to FIG. 9D correspond respectively to the first operation OP1, the third operation OP3, the fourth operation OP4, and the second operation OP2. The control circuit 70, the first to fourth resistances R1 to R4, the first to fourth switches S1 to S4, etc., are not illustrated in these drawings.

Figure 9A:
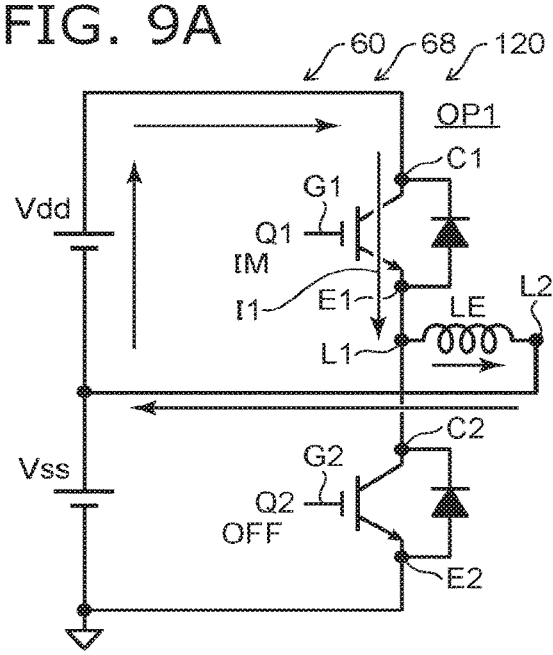
FIG. 9A to FIG. 9D are schematic views illustrating the operation of the control circuit, the semiconductor device, and the electrical circuit device according to the second embodiment.

In the first operation OP1 as shown in FIG. 9A, the control circuit 70 causes the first current I1 to flow from the first collector C1 toward the first emitter E1. The first current I1 flows from the first end portion L1 of the load LE toward the second end portion L2.

Figure 9B:
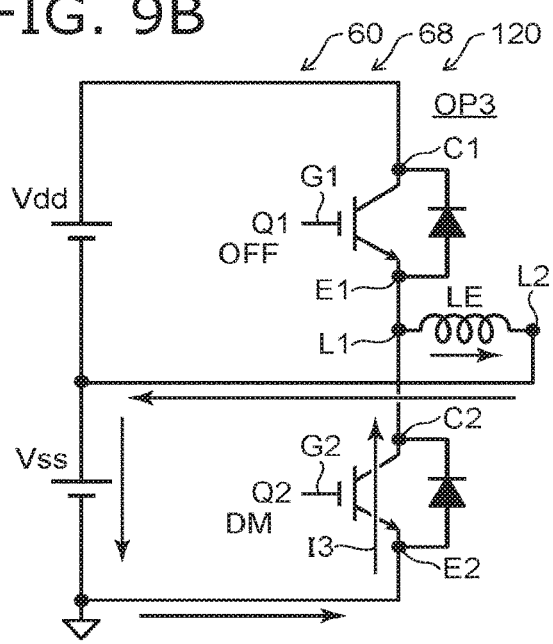
Figure 9C:
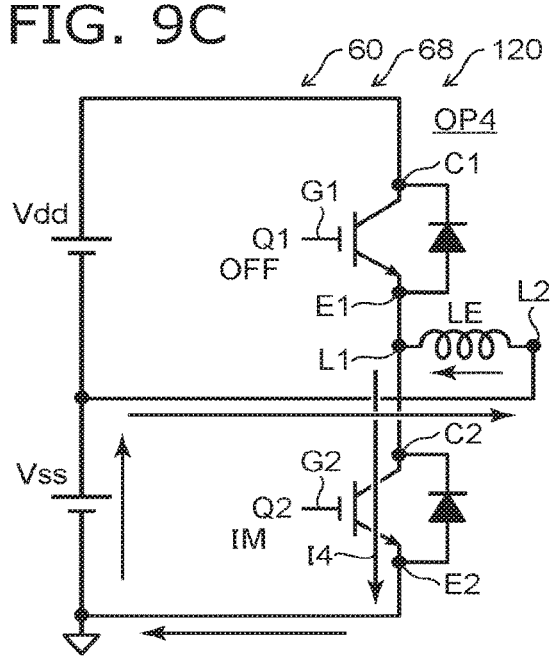
Figure 9D:
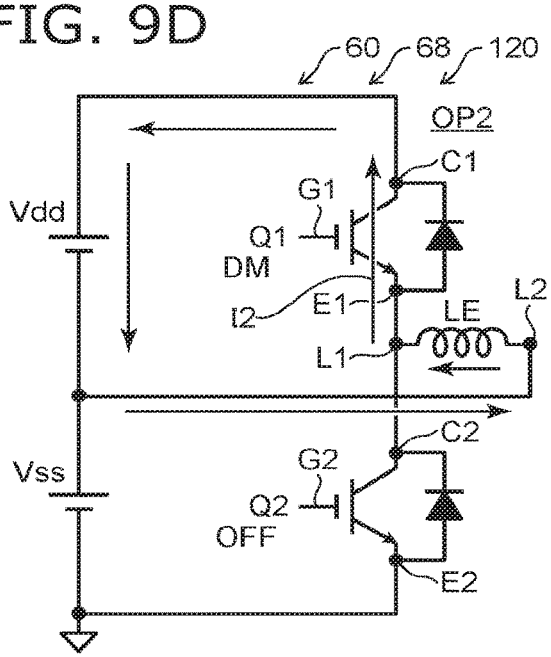

In the second operation OP2 as shown in FIG. 9D, the control circuit 70 causes the second current I2 to flow from the first emitter E1 toward the first collector C1. The second current I2 flows from the second end portion L2 of the load LE toward the first end portion L1.

In the first operation OP1 and the second operation OP2, the control circuit 70 sets the first element Q1 and the second element Q2 to the OFF-state as shown in FIG. 9A and FIG. 9D.

In at least a portion of the third operation OP3 as shown in FIG. 9B, the control circuit 70 causes a third current I3 to flow from the second emitter E2 toward the second collector C2.

In at least a portion of the fourth operation OP4 as shown in FIG. 9C, the control circuit 70 causes a fourth current I4 to flow from the second collector C2 toward the second emitter E2.

In the third operation OP3 and the fourth operation OP4, the control circuit 70 sets the first element Q1 and the second element Q2 to the OFF-state as shown in FIG. 9B and FIG. 9C.

By the operation recited above, a control circuit, a semiconductor device, and an electrical circuit device can be provided in which the loss can be suppressed.

In the embodiment, the first element Q1 and the second element Q2 are RC-IGBTs. The first element Q1 has the configuration illustrated in FIG. 4 described above. The second element Q2 has a configuration similar to that of the first element Q1.

Figure 10:
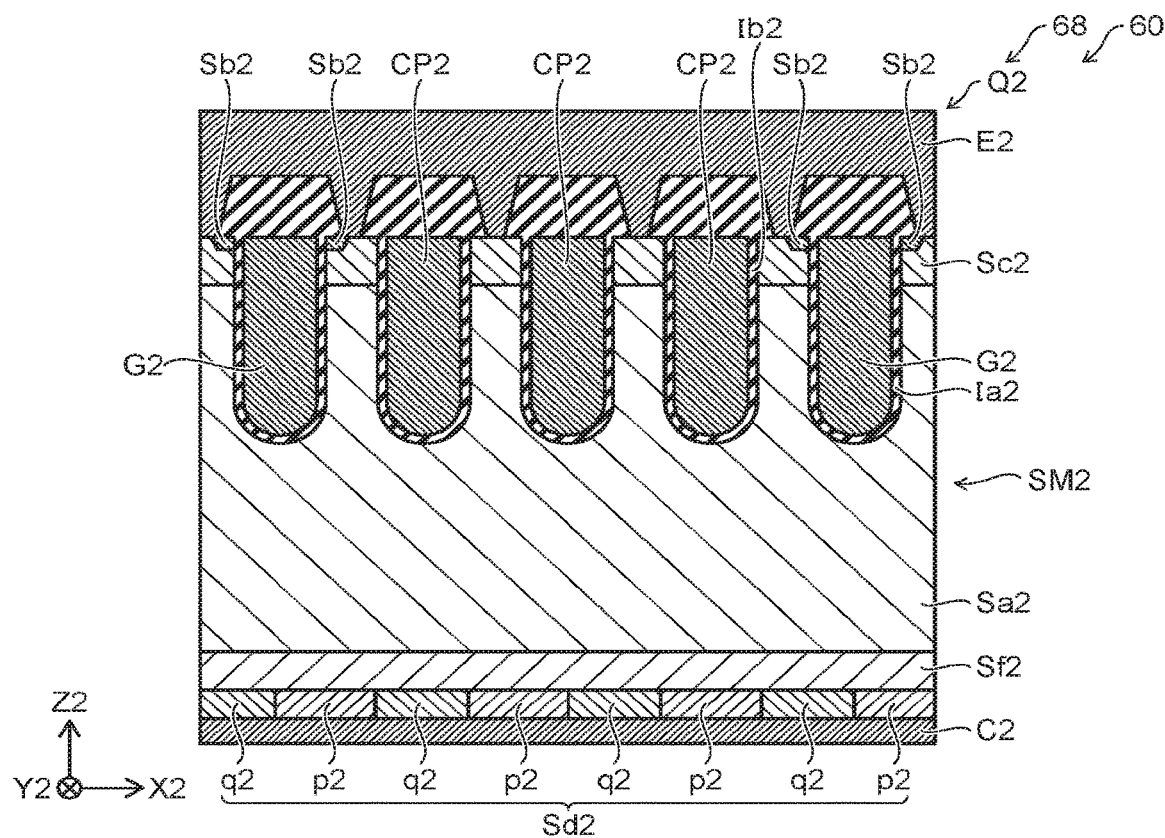
FIG. 10 is a schematic cross-sectional view illustrating the semiconductor device according to the second embodiment.

FIG. 10 is a schematic cross-sectional view illustrating the semiconductor device according to the second embodiment.

FIG. 10 illustrates the second element Q2. As shown in FIG. 10, the second element Q2 includes a semiconductor portion SM2, a conductive portion CP2, a first insulating region Ia2, and a second insulating region Ib2 in addition to the second gate G2, the second collector C2, and the second emitter E2.

The semiconductor portion SM2 of the second element Q2 includes, for example, first to fourth semiconductor regions Sa2 to Sd2. In the example, the semiconductor portion SM2 further includes a semiconductor region Sf2.

The first semiconductor region Sa2 of the second element Q2 is of the first conductivity type and is provided between the second collector C2 and the second emitter E2 in the first direction of the second element Q2 from the second collector C2 toward the second emitter E2. The first direction is, for example, a Z2-axis direction of the second element Q2. One direction perpendicular to the Z2-axis direction is taken as an X2-axis direction. A direction perpendicular to the Z2-axis direction and the X2-axis direction is taken as a Y2-axis direction.

The second semiconductor region Sb2 of the second element Q2 is electrically connected to the second emitter E2 and is of the first conductivity type.

A portion of the third semiconductor region Sc2 of the second element Q2 is of the second conductivity type and is provided between the first semiconductor region Sa2 of the second element Q2 and the second semiconductor region Sb2 of the second element Q2 in the first direction of the second element Q2.

The fourth semiconductor region Sd2 of the second element Q2 is provided between the second collector C2 and the first semiconductor region Sa2 of the second element Q2. The fourth semiconductor region Sd2 of the second element Q2 includes multiple first partial regions p2 of the second element Q2 that are of the first conductivity type, and multiple second partial regions q2 of the second element Q2 that are of the second conductivity type. The multiple first partial regions p2 of the second element Q2 and the multiple second partial regions q2 of the second element Q2 are provided alternately in a direction crossing the first direction of the second element Q2. The direction that crosses the first direction of the second element Q2 is, for example, the X2-axis direction of the second element Q2. The direction that crosses the first direction of the second element Q2 may be any direction along the X2-Y2 plane.

A portion of the first semiconductor region Sa2 of the second element Q2 is between the second gate G2 and the fourth semiconductor region Sd2 of the second element Q2 in the first direction of the second element Q2.

The direction from the second gate G2 toward the third semiconductor region Sc2 of the second element Q2 is aligned with the second direction (e.g., the X2-axis direction) crossing the first direction of the second element Q2.

Another portion of the first semiconductor region Sa1 of the second element Q2 is between the conductive portion CP2 of the second element Q2 and the fourth semiconductor region Sd2 of the second element Q2 in the first direction of the second element Q2.

The direction from the conductive portion CP2 of the second element Q2 toward the third semiconductor region Sc2 of the second element Q2 is aligned with the second direction (e.g., the X2-axis direction) of the second element Q2.

The first insulating region Ia2 of the second element Q2 is provided between the second gate G2 and the semiconductor portion SM2 of the second element Q2 and between the second gate G2 and the second emitter E2.

The second insulating region Ib2 of the second element Q2 is provided between the conductive portion CP2 of the second element Q2 and the semiconductor portion SM2 of the second element Q2 and between the second emitter E2 and the conductive portion CP2 of the second element Q2.

The semiconductor region Sf2 of the second element Q2 is provided between the fourth semiconductor region Sd2 of the second element Q2 and the first semiconductor region Sa2 of the second element Q2 in the first direction of the second element Q2. The semiconductor region Sf2 of the second element Q2 is of the first conductivity type.

For example, the second element Q2 which is an RC-IGBT is obtained from such a configuration. The configuration of the second element Q2 may be substantially the same as the configuration of the first element Q1. The third resistance R3 may be substantially the same as the first resistance R1. The fourth resistance R4 may be substantially the same as the second resistance R2. For example, the conductive portion CP2 is electrically connected to the second emitter E2. The connection may be performed via a conductive member of a mounting substrate, etc. As recited above, a portion of the third semiconductor region Sc2 of the second element Q2 is provided between the first semiconductor region Sa2 of the second element Q2 and the second semiconductor region Sb2 of the second element Q2 in the first direction (the Z2-axis direction). Another portion of the third semiconductor region Sc2 of the second element Q2 is not between the first semiconductor region Sa2 of the second element Q2 and the second semiconductor region Sb2 of the second element Q2 in the Z2-axis direction. The second semiconductor region Sb2 of the second element Q2 is not provided on the other portion of the third semiconductor region Sc2 of the second element Q2. The second insulating region Ib2 of the second element Q2 contacts the other portion of the third semiconductor region Sc2 of the second element Q2 and the conductive portion CP2 of the second element Q2.

Figure 11:
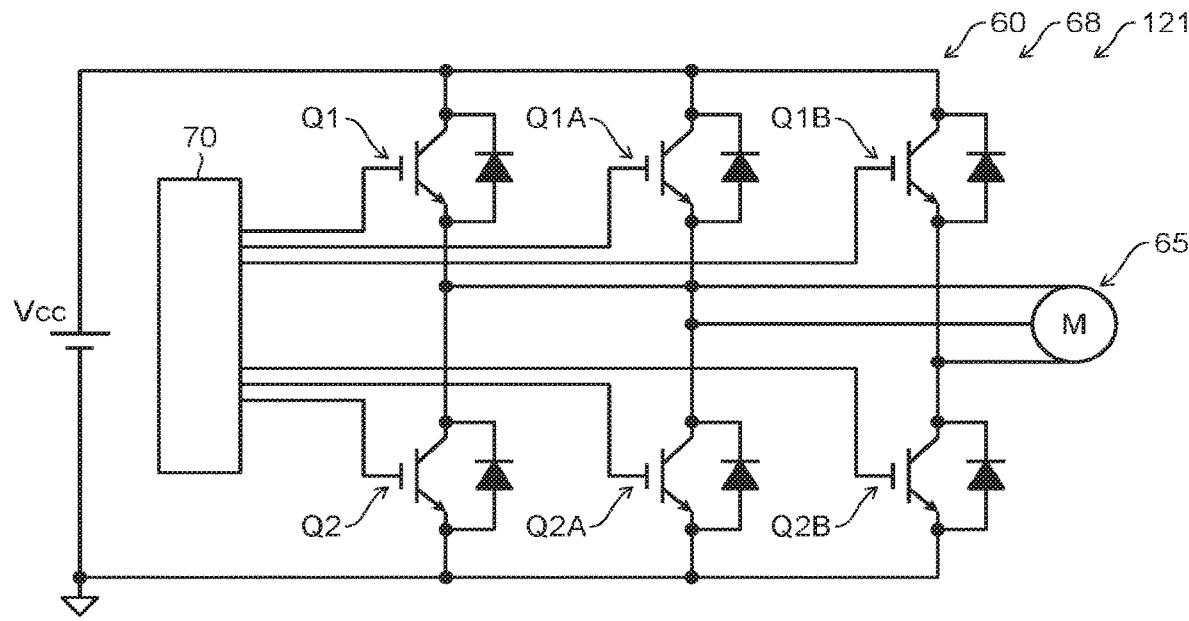
FIG. 11 is a schematic view illustrating the control circuit, the semiconductor device, and the electrical circuit device according to the second embodiment.

FIG. 11 is a schematic view illustrating the control circuit, the semiconductor device, and the electrical circuit device according to the second embodiment.

In the electrical circuit device 121 as shown in FIG. 11, the element portion 60 that is included in the semiconductor device 68 includes multiple sets including the first element Q1 and the second element Q2. For example, one set includes the first element Q1 and the second element Q2. Another set includes a first element Q1A and a second element Q2A. Yet another set includes a first element Q1B and a second element Q2B. The first element Q1A and the second element Q2A have configurations similar to those of the first element Q1 and the second element Q2. The first element Q1B and the second element Q2B have configurations similar to those of the first element Q1 and the second element Q2. For example, these sets are connected to a three-phase motor 65 or the like. The multiple resistances (e.g., the first resistance R1, the second resistance R2, etc.) that are connected to the gates of the elements are not illustrated in FIG. 11.

For example, the operation described in reference to FIG. 7A to FIG. 7D, FIG. 8A, FIG. 8B, and FIG. 9A to FIG. 9D is applied to each of the three sets. The operation recited above is performed for the three sets with the phases shifted 120 degrees. The loss can be suppressed in the electrical circuit device 121 (the control circuit 70 and the semiconductor device 68).

Third Embodiment

FIG. 12A to FIG. 12D are schematic views illustrating a control circuit, a semiconductor device, and an electrical circuit device according to a third embodiment.

The electrical circuit device 130 according to the embodiment includes the semiconductor device 68 and the control circuit 70. The electrical circuit device 130 may further include the power supply 78. These drawings correspond to the first to fourth operations OP1 to OP4 performed by the control circuit 70. In the example as shown in these drawings, the element portion 60 that is included in the semiconductor device 68 further includes the second to fourth elements Q2 to Q4 in addition to the first element Q1.

The second element Q2 includes the second gate G2, the second collector C2, and the second emitter E2. The third element Q3 includes a third gate G3, a third collector C3, and a third emitter E3. The fourth element Q4 includes a fourth gate G4, a fourth collector C4, and a fourth emitter E4.

The first emitter E1 of the first element Q1 is electrically connected to the second collector C2. The first collector C1 is electrically connected to the third collector C3. The first emitter E1 is electrically connected also to the first end portion L1 of the load LE. The third emitter E3 is electrically connected to the fourth collector C4 and the second end portion L2 of the load LE. The second emitter E2 is electrically connected to the fourth emitter E4.

For example, a voltage Vcc is applied between the first collector C1 and the second emitter E2. For example, the voltage Vcc is supplied from the power supply 78.

As described below, for example, the control circuit 70 performs the first polar operation PP1 and the second polar operation PP2.

Figure 13A:
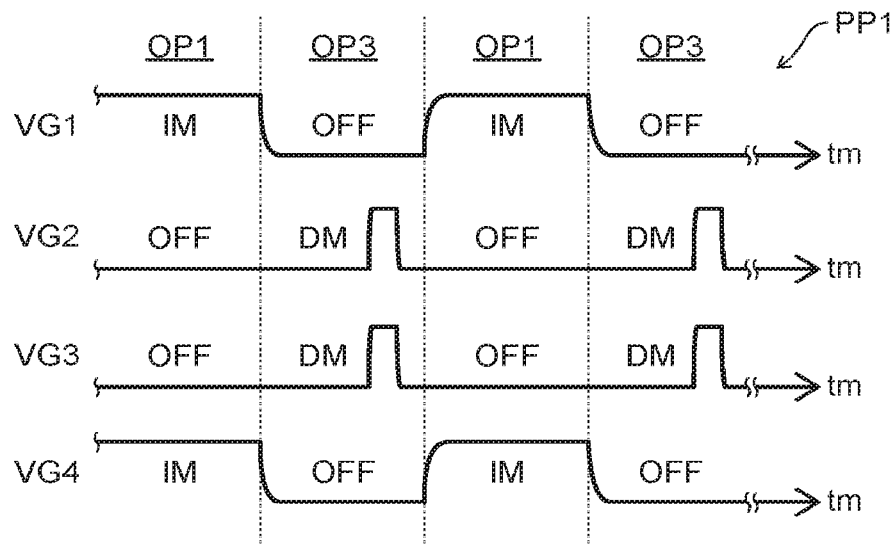
FIG. 13A to FIG. 13C are schematic views illustrating the operation of the control circuit, the semiconductor device, and the electrical circuit device according to the third embodiment.
Figure 13B:
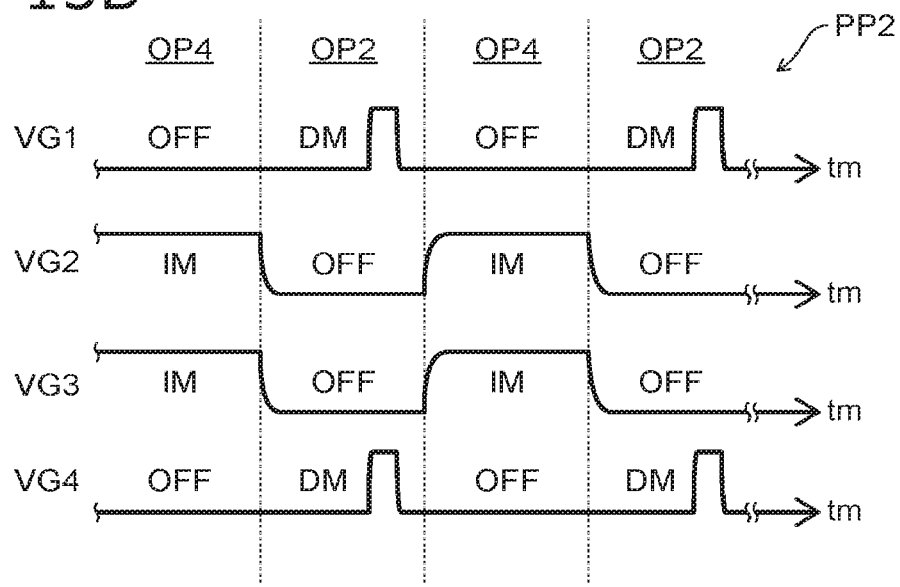
Figure 13C:
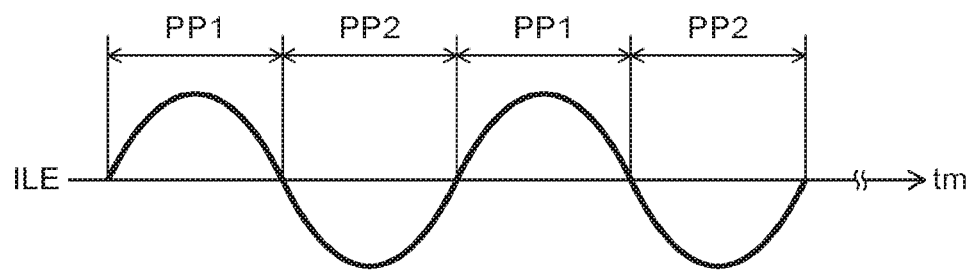

FIG. 13A to FIG. 13C are schematic views illustrating the operation of the control circuit, the semiconductor device, and the electrical circuit device according to the third embodiment.

FIG. 13A corresponds to the first polar operation PP1. FIG. 13B corresponds to the second polar operation PP2. FIG. 13C corresponds to the current flowing in the load LE. In these drawings, the horizontal axis corresponds to the time tm. In FIG. 13A and FIG. 13B, the vertical axis corresponds to the gate voltages (the first to fourth gate voltages VG1 to VG4) of the first to fourth gates G1 to G4. The vertical axis of FIG. 13C corresponds to a current ILE flowing in the load LE.

The control circuit 70 performs at least the first polar operation PP1 of repeating the first operation OP1 and the third operation OP3, and the second polar operation PP2 of repeating the second operation OP2 and the fourth operation OP4. An example of the first to fourth operations OP1 to OP4 will now be described.

FIG. 14A to FIG. 14D are schematic views illustrating the operation of the control circuit, the semiconductor device, and the electrical circuit device according to the third embodiment.

Figure 14A:
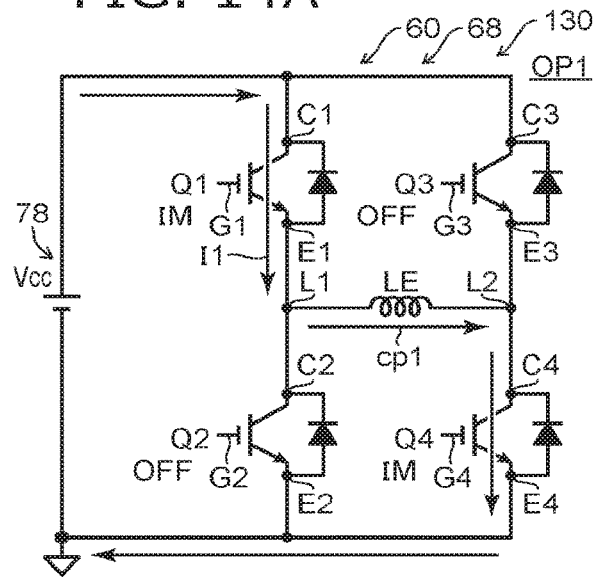
FIG. 14A to FIG. 14D are schematic views illustrating the operation of the control circuit, the semiconductor device, and the electrical circuit device according to the third embodiment.
Figure 14B:
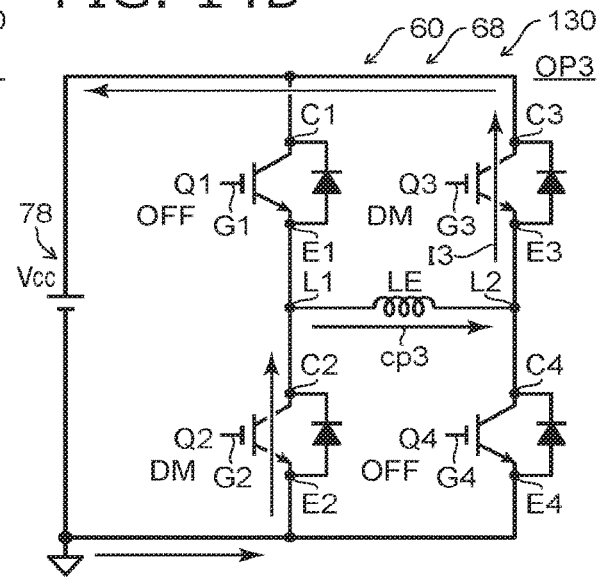
Figure 14C:
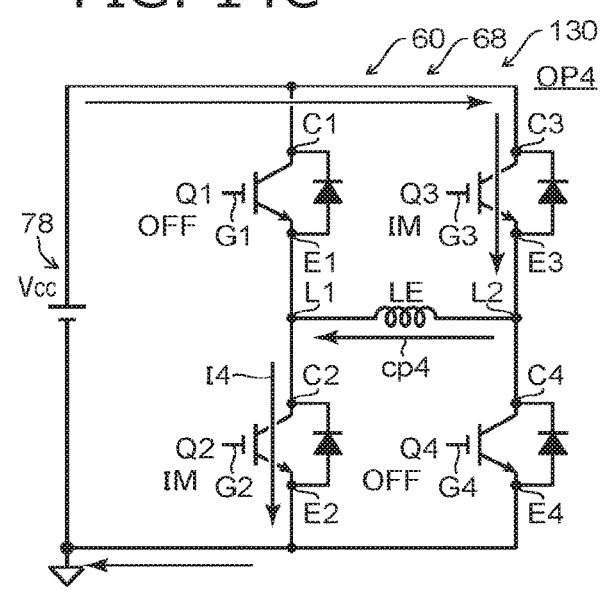
Figure 14D:
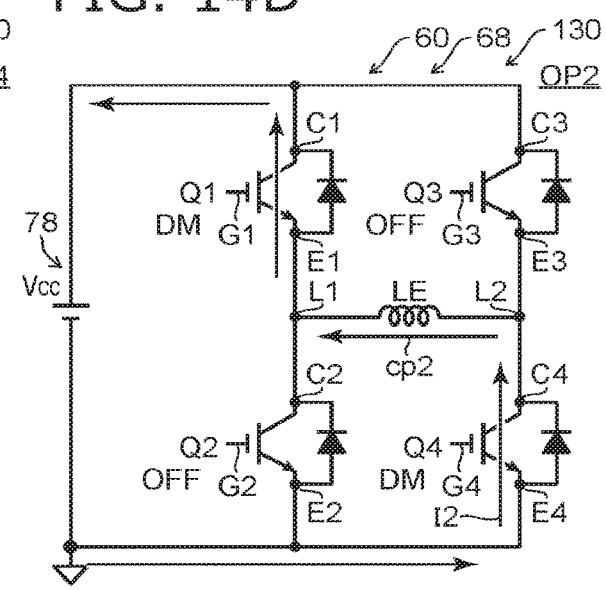

FIG. 14A corresponds to the first operation OP1. FIG. 14B corresponds to the third operation OP3. FIG. 14C corresponds to the fourth operation OP4. FIG. 14D corresponds to the second operation OP2. The control circuit 70 is not illustrated in these drawings.

In at least a portion of the first operation OP1 as shown in FIG. 14A, the control circuit 70 causes the first current I1 to flow in a first path cp1 from the first collector C1 toward the first emitter E1, from the first end portion L1 toward the second end portion L2, and from the fourth collector C4 toward the fourth emitter E4. In the first operation OP1, the control circuit 70 sets the second element Q2 and the third element Q3 to the OFF-state.

In at least a portion of the second operation OP2 as shown in FIG. 14D, the control circuit 70 causes the second current I2 to flow in a second path cp2 from the fourth emitter E4 toward the fourth collector C4, from the second end portion L2 toward the first end portion L1, and from the first emitter E1 toward the first collector C1. In the second operation OP2, the control circuit 70 sets the second element Q2 and the third element Q3 to the OFF-state.

In at least a portion of the third operation OP3 as shown in FIG. 14B, the control circuit 70 causes the third current I3 to flow in a third path cp3 from the second emitter E2 toward the second collector C2, from the first end portion L1 toward the second end portion L2, and from the third emitter E3 toward the third collector C3. In the third operation OP3, the control circuit 70 sets the first element Q1 and the fourth element Q4 to the OFF-state.

In at least a portion of the fourth operation OP4 as shown in FIG. 14C, the control circuit 70 causes the fourth current I4 to flow in a fourth path cp4 from the third collector C3 toward the third emitter E3, from the second end portion L2 toward the first end portion L1, and from the second collector C2 toward the second emitter E2. In the fourth operation OP4, the control circuit 70 sets the first element Q1 and the fourth element Q4 to the OFF-state.

In such an operation as described below, the time constant of the switching is mutually-different.

As shown in FIG. 13A and FIG. 13B, the time constant (the first time constant) of the switching of the first element Q1 in the first operation OP1 is different from the time constant (the second time constant) of the switching of the first element Q1 in the second operation OP2. For example, the second time constant is shorter than the first time constant.

The time constant (the third time constant) of the switching of the second element Q2 in the fourth operation OP4 is different from the time constant (the fourth time constant) of the switching of the second element Q2 in the third operation OP3. For example, the fourth time constant is shorter than the third time constant.

The time constant (the fifth time constant) of the switching of the third element Q3 in the fourth operation OP4 is different from the time constant (the sixth time constant) of the switching of the third element Q3 in the third operation OP3. For example, the sixth time constant is shorter than the fifth time constant.

The time constant (the seventh time constant) of the switching of the fourth element Q4 in the first operation OP1 is different from the time constant (the eighth time constant) of the switching of the fourth element Q4 in the second operation OP2. For example, the eighth time constant is shorter than the seventh time constant.

For example, the time constant in the diode mode DM is shorter than the time constant in the IGBT mode IM in each of the first to fourth elements Q1 to Q4. Thereby, in the diode mode DM, the recovery loss can be reduced while suppressing the increase of the conduction loss. The breakdown of the element in the IGBT mode IM is suppressed. In the embodiment as well, a control circuit, a semiconductor device, and an electrical circuit device can be provided in which the loss can be suppressed.

Such a time constant difference may be obtained by the difference between the resistances connected to the gates.

Figure 12A:
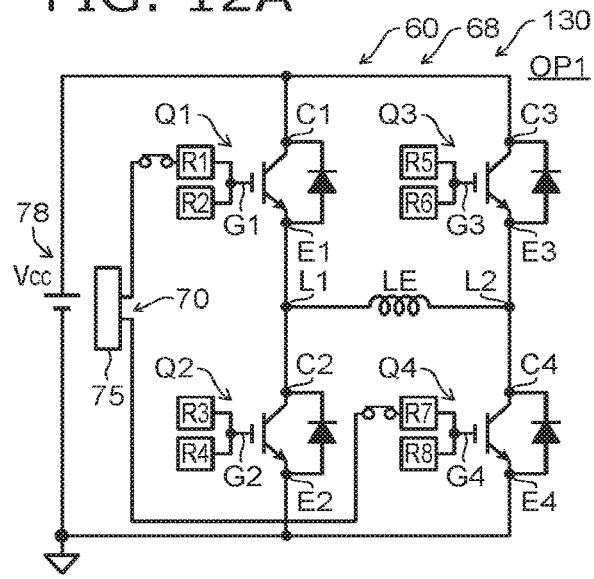
FIG. 12A to FIG. 12D are schematic views illustrating a control circuit, a semiconductor device, and an electrical circuit device according to a third embodiment.

For example, as shown in FIG. 12A, the element portion 60 includes the first to eighth resistances R1 to R8. The first resistance R1 is electrically connected to the first gate G1. The second resistance R2 is electrically connected to the first gate G1 and is lower than the first resistance R1. The third resistance R3 is electrically connected to the second gate G2. The fourth resistance R4 is electrically connected to the second gate G2 and is lower than the third resistance R3. The fourth resistance R4 is electrically connected to the third gate G3. The sixth resistance R6 is electrically connected to the third gate G3 and is lower than the fifth resistance R5. The seventh resistance R7 is electrically connected to the fourth gate G4. The eighth resistance R8 is electrically connected to the fourth gate G4 and is lower than the seventh resistance R7.

In the first operation OP1 as shown in FIG. 12A, the control circuit 70 is electrically connected to the first gate G1 via the first resistance R1 and electrically connected to the fourth gate G4 via the seventh resistance R7.

Figure 12B:
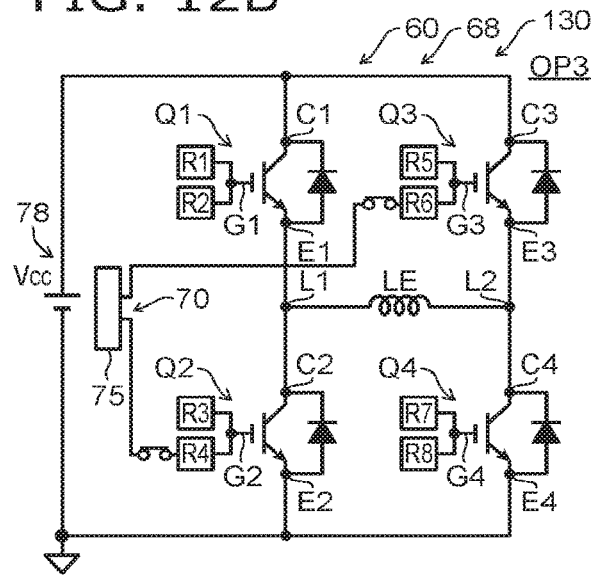
Figure 12C:
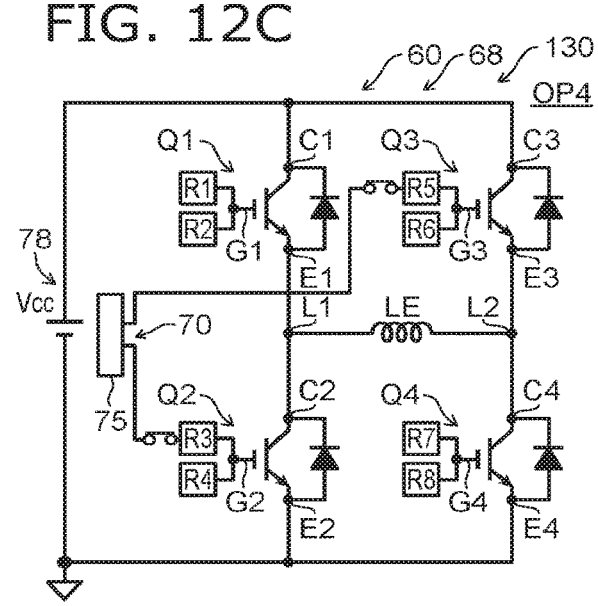
Figure 12D:
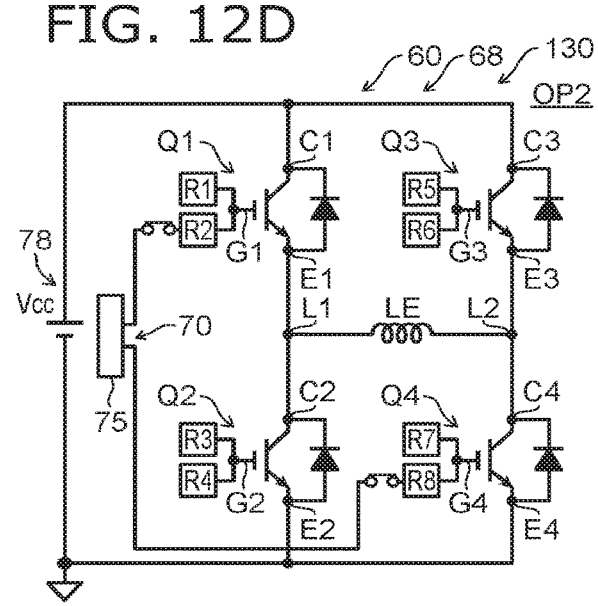

In the second operation OP2 as shown in FIG. 12D, the control circuit 70 is electrically connected to the first gate G1 via the second resistance R2 and electrically connected to the fourth gate G4 via the eighth resistance R8.

In the third operation OP3 as shown in FIG. 12B, the control circuit 70 is electrically connected to the second gate G2 via the fourth resistance R4 and electrically connected to the third gate G3 via the sixth resistance R6.

In the fourth operation OP4 as shown in FIG. 12C, the control circuit 70 is electrically connected to the second gate G2 via the third resistance R3 and electrically connected to the third gate G3 via the fifth resistance R5.

In the embodiment, the time constant can be changed by modifying at least one of the electrical resistance, the electrical capacitance, or the inductance of the current path including the gate between the first operation OP1 and the second operation OP2.

The description that relates to the first resistance R1 is applicable to the third resistance R3, the fifth resistance R5, and the seventh resistance R7. The description that relates to the second resistance R2 is applicable to the fourth resistance R4, the sixth resistance R6, and the eighth resistance R8.

In the third embodiment, the first to fourth elements Q1 to Q4 are, for example, RC-IGBTs. The first element Q1 has the configuration illustrated in FIG. 4 described above. The second element Q2 has the configuration illustrated in FIG. 10 described above. Examples of the configurations of the third element Q3 and the fourth element Q4 will now be described.

Figure 15:
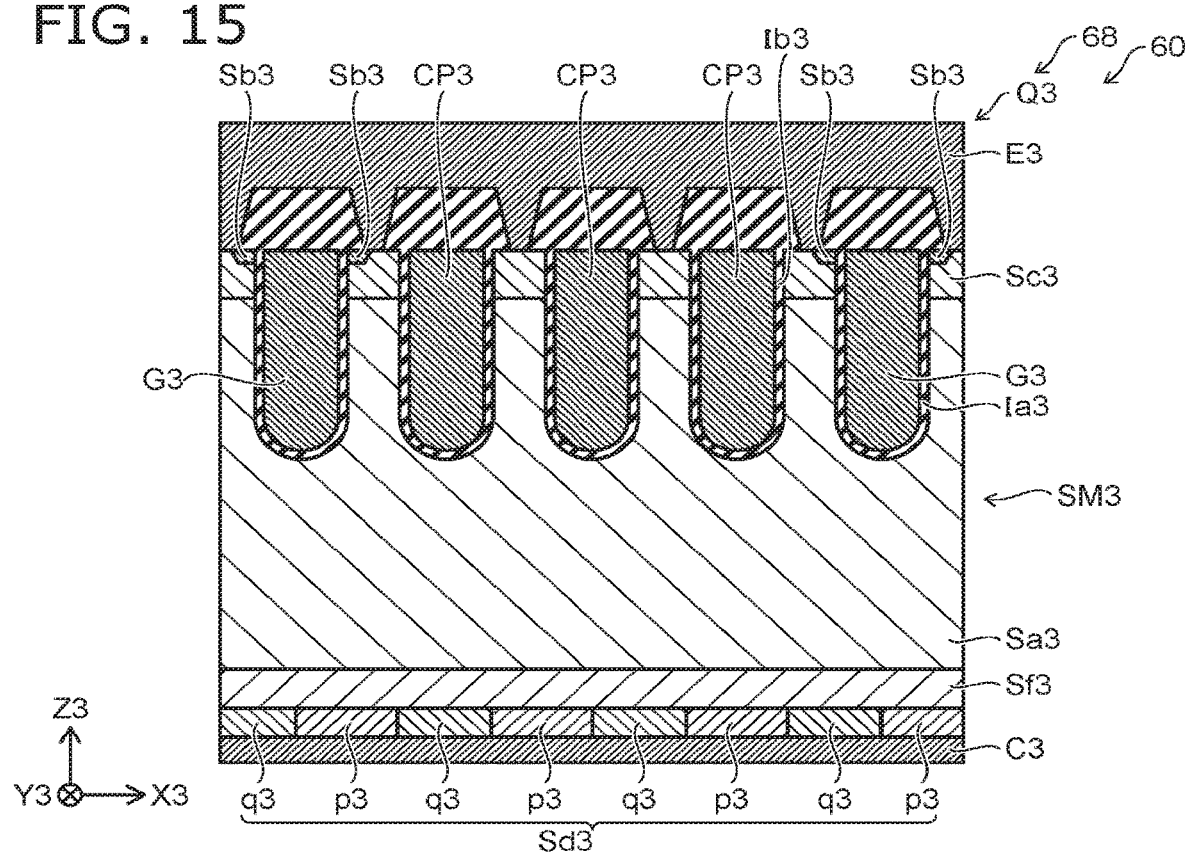
FIG. 15 is a schematic cross-sectional view illustrating the semiconductor device according to the third embodiment.

FIG. 15 is a schematic cross-sectional view illustrating the semiconductor device according to the third embodiment.

FIG. 15 illustrates the third element Q3. As shown in FIG. 15, the third element Q3 includes a semiconductor portion SM3, a conductive portion CP3, a first insulating region Ia3, and a second insulating region Ib3 in addition to the third gate G3, the third collector C3, and the third emitter E3.

The semiconductor portion SM3 of the third element Q3 includes, for example, first to fourth semiconductor regions Sa3 to Sd3. In the example, the semiconductor portion SM3 further includes a semiconductor region Sf3.

The first semiconductor region Sa3 of the third element Q3 is of the first conductivity type and is provided between the third collector C3 and the third emitter E3 in the first direction of the third element Q3 which is from the third collector C3 toward the third emitter E3. The first direction is, for example, a Z3-axis direction of the third element Q3. One direction perpendicular to the Z3-axis direction is taken as an X3-axis direction. A direction perpendicular to the Z3-axis direction and the X3-axis direction is taken as a Y3-axis direction.

The second semiconductor region Sb3 of the third element Q3 is electrically connected to the third emitter E3 and is of the first conductivity type.

A portion of the third semiconductor region Sc3 of the third element Q3 is of the second conductivity type and is provided between the first semiconductor region Sa3 of the third element Q3 and the second semiconductor region Sb3 of the third element Q3 in the first direction of the third element Q3.

The fourth semiconductor region Sd3 of the third element Q3 is provided between the third collector C3 and the first semiconductor region Sa3 of the third element Q3. The fourth semiconductor region Sd3 of the third element Q3 includes multiple first partial regions p3 of the third element Q3 that are of the first conductivity type, and multiple second partial regions q3 of the third element Q3 that are of the second conductivity type. The multiple first partial regions p3 of the third element Q3 and the multiple second partial regions q3 of the third element Q3 are provided alternately in a direction crossing the first direction of the third element Q3. The direction that crosses the first direction of the third element Q3 is, for example, the X3-axis direction of the third element Q3. The direction that crosses the first direction of the third element Q3 may be any direction along the X3-Y3 plane.

A portion of the first semiconductor region Sa3 of the third element Q3 is between the third gate G3 and the fourth semiconductor region Sd3 of the third element Q3 in the first direction of the third element Q3.

The direction from the third gate G3 toward the third semiconductor region Sc3 of the third element Q3 is aligned with the second direction (e.g., the X3-axis direction) crossing the first direction of the third element Q3.

Another portion of the first semiconductor region Sa3 of the third element Q3 is between the conductive portion CP3 of the third element Q3 and the fourth semiconductor region Sd3 of the third element Q3 in the first direction of the third element Q3.

The direction from the conductive portion CP3 of the third element Q3 toward the third semiconductor region Sc3 of the third element Q3 is aligned with the second direction (e.g., the X3-axis direction) of the third element Q3.

The first insulating region Ia3 of the third element Q3 is provided between the third gate G3 and the semiconductor portion SM3 of the third element Q3 and between the third gate G3 and the third emitter E3.

The second insulating region Ib3 of the third element Q3 is provided between the conductive portion CP3 of the third element Q3 and the semiconductor portion SM3 of the third element Q3 and between the third emitter E3 and the conductive portion CP3 of the third element Q3.

The semiconductor region Sf3 of the third element Q3 is provided between the fourth semiconductor region Sd3 of the third element Q3 and the first semiconductor region Sa3 of the third element Q3 in the first direction of the third element Q3. The semiconductor region Sf3 of the third element Q3 is of the first conductivity type.

For example, the third element Q3 which is an RC-IGBT is obtained from such a configuration. The configuration of the third element Q3 may be substantially the same as the configuration of the first element Q1. For example, the conductive portion CP3 is electrically connected to the third emitter E3. The connection may be performed via a conductive member of a mounting substrate, etc. As recited above, a portion of the third semiconductor region Sc3 of the third element Q3 is provided between the first semiconductor region Sa3 of the third element Q3 and the second semiconductor region Sb3 of the third element Q3 in the first direction (the Z3-axis direction). Another portion of the third semiconductor region Sc3 of the third element Q3 is not between the first semiconductor region Sa3 of the third element Q3 and the second semiconductor region Sb3 of the third element Q3 in the Z3-axis direction. The second semiconductor region Sb3 of the third element Q3 is not provided on the other portion of the third semiconductor region Sc3 of the third element Q3. The second insulating region Ib3 of the third element Q3 contacts the other portion of the third semiconductor region Sc3 of the third element Q3 and the conductive portion CP3 of the third element Q3.

Figure 16:
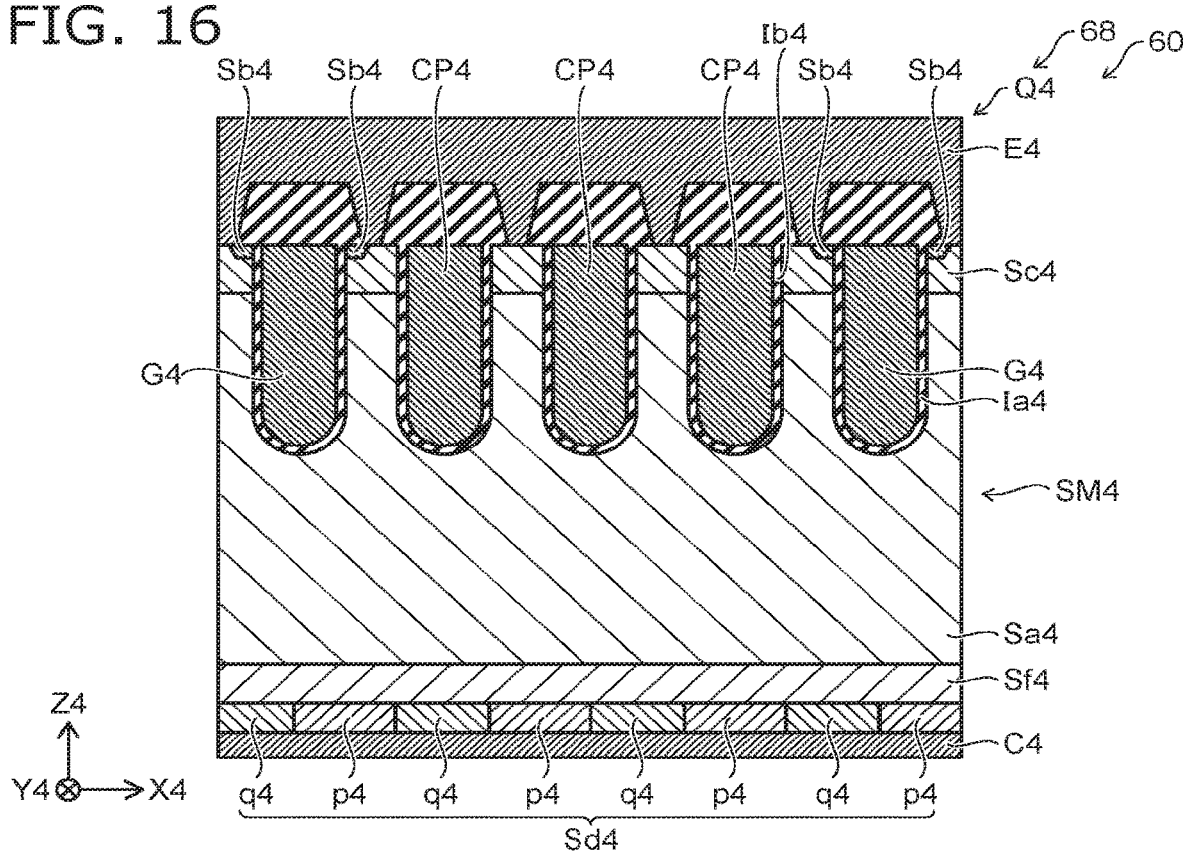
FIG. 16 is a schematic cross-sectional view illustrating the semiconductor device according to the third embodiment.

FIG. 16 is a schematic cross-sectional view illustrating the semiconductor device according to the third embodiment.

FIG. 16 illustrates the fourth element Q4. As shown in FIG. 16, the fourth element Q4 includes a semiconductor portion SM4, a conductive portion CP4, a first insulating region Ia4, and a second insulating region Ib4 in addition to the fourth gate G4, the fourth collector C4, and the fourth emitter E4.

The semiconductor portion SM4 of the fourth element Q4 includes, for example, first to fourth semiconductor regions Sa4 to Sd4. In the example, the semiconductor portion SM4 further includes a semiconductor region Sf4.

The first semiconductor region Sa4 of the fourth element Q4 is of the first conductivity type and is provided between the fourth collector C4 and the fourth emitter E4 in the first direction of the fourth element Q4 which is from the fourth collector C4 toward the fourth emitter E4. The first direction is, for example, a Z4-axis direction of the fourth element Q4. One direction perpendicular to the Z4-axis direction is taken as an X4-axis direction. A direction perpendicular to the Z4-axis direction and the X4-axis direction is taken as a Y4-axis direction.

The second semiconductor region Sb4 of the fourth element Q4 is electrically connected to the fourth emitter E4 and is of the first conductivity type.

A portion of the third semiconductor region Sc4 of the fourth element Q4 is of the second conductivity type and is provided between the first semiconductor region Sa4 of the fourth element Q4 and the second semiconductor region Sb4 of the fourth element Q4 in the first direction of the fourth element Q4.

The fourth semiconductor region Sd4 of the fourth element Q4 is provided between the fourth collector C4 and the first semiconductor region Sa4 of the fourth element Q4. The fourth semiconductor region Sd4 of the fourth element Q4 includes multiple first partial regions p4 of the fourth element Q4 that are of the first conductivity type, and multiple second partial regions q4 of the fourth element Q4 that are of the second conductivity type. The multiple first partial regions p4 of the fourth element Q4 and the multiple second partial regions q4 of the fourth element Q4 are provided alternately in a direction crossing the first direction of the fourth element Q4. The direction that crosses the first direction of the fourth element Q4 is, for example, the X4-axis direction of the fourth element Q4. The direction that crosses the first direction of the fourth element Q4 may be any direction along the X4-Y4 plane.

A portion of the first semiconductor region Sa4 of the fourth element Q4 is between the fourth gate G4 and the fourth semiconductor region Sd4 of the fourth element Q4 in the first direction of the fourth element Q4.

The direction from the fourth gate G4 toward the third semiconductor region Sc4 of the fourth element Q4 is aligned with the second direction (e.g., the X4-axis direction) crossing the first direction of the fourth element Q4.

Another portion of the first semiconductor region Sa4 of the fourth element Q4 is between the conductive portion CP4 of the fourth element Q4 and the fourth semiconductor region Sd4 of the fourth element Q4 in the first direction of the fourth element Q4.

The direction from the conductive portion CP4 of the fourth element Q4 toward the third semiconductor region Sc4 of the fourth element Q4 is aligned with the second direction (e.g., the X4-axis direction) of the fourth element Q4.

The first insulating region Ia4 of the fourth element Q4 is provided between the fourth gate G4 and the semiconductor portion SM4 of the fourth element Q4 and between the fourth gate G4 and the fourth emitter E4.

The second insulating region Ib4 of the fourth element Q4 is provided between the conductive portion CP4 of the fourth element Q4 and the semiconductor portion SM4 of the fourth element Q4 and between the fourth emitter E4 and the conductive portion CP4 of the fourth element Q4.

The semiconductor region Sf4 of the fourth element Q4 is provided between the fourth semiconductor region Sd4 of the fourth element Q4 and the first semiconductor region Sa4 of the fourth element Q4 in the first direction of the fourth element Q4. The semiconductor region Sf4 of the fourth element Q4 is of the first conductivity type.

For example, the fourth element Q4 which is an RC-IGBT is obtained from such a configuration. The configuration of the fourth element Q4 may be substantially the same as the configuration of the first element Q1. For example, the conductive portion CP4 is electrically connected to the fourth emitter E4. The connection may be performed via a conductive member of a mounting substrate, etc. As recited above, a portion of the third semiconductor region Sc4 of the fourth element Q4 is provided between the first semiconductor region Sa4 of the fourth element Q4 and the second semiconductor region Sb4 of the fourth element Q4 in the first direction (the Z4-axis direction). Another portion of the third semiconductor region Sc4 of the fourth element Q4 is not between the first semiconductor region Sa4 of the fourth element Q4 and the second semiconductor region Sb4 of the fourth element Q4 in the Z4-axis direction. The second semiconductor region Sb4 of the fourth element Q4 is not provided on the other portion of the third semiconductor region Sc4 of the fourth element Q4. The second insulating region Ib4 of the fourth element Q4 contacts the other portion of the third semiconductor region Sc4 of the fourth element Q4 and the conductive portion CP4 of the fourth element Q4.

Figure 17A:
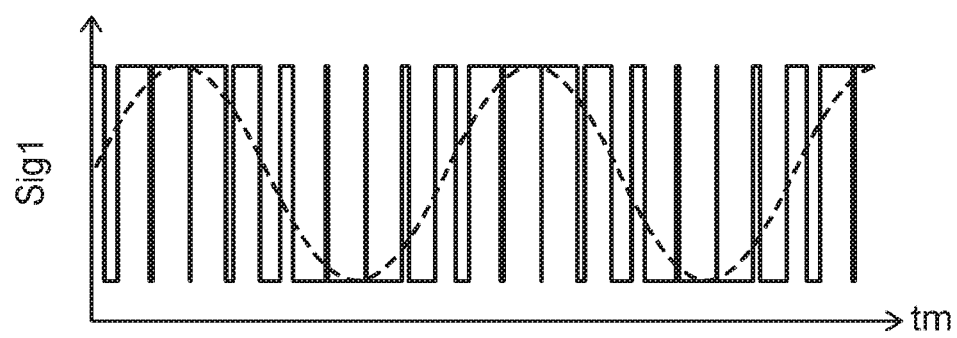
FIG. 17A and FIG. 17B are schematic views illustrating the operation of the control circuit and the electrical circuit device according to the third embodiment.
Figure 17B:
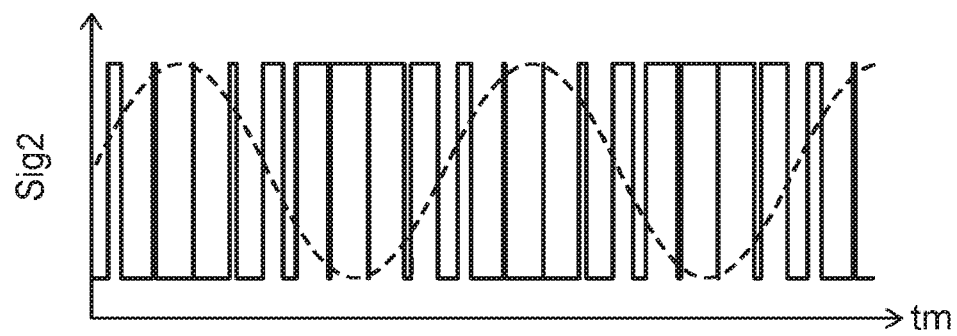

FIG. 17A and FIG. 17B are schematic views illustrating the operation of the control circuit and the electrical circuit device according to the third embodiment.

FIG. 17A illustrates a control signal Sig1 relating to the first element Q1 and the fourth element Q4. FIG. 17B illustrates a control signal Sig2 relating to the second element Q2 and the third element Q3. In these drawings, the horizontal axis is the time tm. The vertical axis corresponds to the intensity of the control signal.

For example, these control signals are generated in the control circuit 70. For example, a triangular wave and a sine wave are input to a comparator. The output of the comparator is used as the control signal Sig1. For example, the reverse ("NOT") of the output of the comparator is used as the control signal Sig2. For example, the length of the period in which the control signal Sig1 is relatively large and the length of the period in which the control signal Sig1 is relatively small are modified. For example, the length of the period in which the control signal Sig2 is relatively small and the length of the period in which the control signal Sig2 is relatively large are modified. Thereby, for example, a control is performed by PWM (Pulse Width Modulation). For example, an inverter control of power equipment, etc., can be performed. For example, the embodiment is applicable to various applications such as an industrial motor, wind power generation, an electric car, etc.

The control signals illustrated in FIG. 17A and FIG. 17B are applicable to the second embodiment.

Fourth Embodiment

A fourth embodiment relates to the semiconductor device 68. The semiconductor device 68 includes, for example, the element portion 60 (referring to FIG. 1A). The element portion 60 includes the first element Q1. The first element Q1 includes the first resistance R1, and the second resistance R2 that is lower than the first resistance R1. For example, the first element Q1 has the configuration described in reference to FIG. 5. The first resistance R1 is electrically connected to the first gate G1; and the second resistance R2 is electrically connected to the first gate G1 (referring to FIG. 1A). Switching that has multiple time constants is obtained from such a configuration. A semiconductor device can be provided in which the loss can be suppressed.

The element portion 60 may further include the second element Q2. In such a case, the element portion 60 may further include the third resistance R3 and the fourth resistance R4. The element portion 60 may further include the third element Q3 and the fourth element Q4. In such a case, the element portion 60 may further include the fifth to eighth resistances R5 to R8. A semiconductor device can be provided in which the loss can be suppressed.

The electrical circuit device (e.g., the electrical circuit devices 110, 120, 121, 130, or the like) according to the embodiment includes, for example, any control circuit 70 described in reference to the first to third embodiments, and the semiconductor device 68 including any element portion 60 recited above. An electrical circuit device can be provided in which the loss can be suppressed.

At least one of the first to eighth resistances R1 to R8 recited above may be included in the semiconductor device 68. At least one of the first to eighth resistances R1 to R8 recited above may be included in the control circuit 70. At least one of the multiple switches recited above may be included in the semiconductor device 68 or the control circuit 70.

According to the embodiments, a control circuit, a semiconductor device, and an electrical circuit device can be provided in which the loss can be suppressed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel. Hereinabove, exemplary embodiments of the invention are described with reference to specific examples. However, the embodiments of the invention are not limited to these specific examples. For example, one skilled in the art may similarly practice the invention by appropriately selecting specific configurations of components included in control circuits such as controllers, switches, and included in semiconductor devices such as element portions, elements, semiconductor portions, semiconductor regions, insulating regions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all control circuits, semiconductor devices, and electrical circuit devices practicable by an appropriate design modification by one skilled in the art based on the control circuits, the semiconductor devices, and the electrical circuit devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A control circuit comprising:
    a first element including a first gate, a first collector, and a first emitter; and
    circuitry configured to perform a first operation and a second operation,
    in at least a portion of the first operation, the circuitry causing a first current to flow from the first collector toward the first emitter,
    in at least a portion of the second operation, the circuitry causing a second current to flow from the first emitter toward the first collector,
    a first time constant for a rising of a switching of the first element in the first operation being different from a second time constant for a rising of a switching of the first element in the second operation, and
    a third time constant for a falling of the switching of the first element in the first operation being different from a fourth time constant for a falling of the switching of the first element in the second operation.

2. The control circuit according to claim 1, wherein the second time constant is shorter than the first time constant, and the fourth time constant is shorter than the third time constant.

3. The control circuit according to claim 1, wherein the first element is an reverse-conducting insulated gate bipolar transistor (RC-IGBT).

4. The control circuit according to claim 1, wherein
    the first element includes:
        a semiconductor portion;
        a conductive portion;
        a first insulating region; and
        a second insulating region,
    the semiconductor portion includes:
        a first semiconductor region provided between the first collector and the first emitter in a first direction, the first direction being from the first collector toward the first emitter, the first semiconductor region being of a first conductivity type;
        a second semiconductor region electrically connected to the first emitter, the second semiconductor region being of the first conductivity type;
        a third semiconductor region of a second conductivity type, a portion of the third semiconductor region being provided between the first semiconductor region and the second semiconductor region in the first direction; and
        a fourth semiconductor region provided between the first semiconductor region and the first collector, the fourth semiconductor region including a plurality of first partial regions and a plurality of second partial regions, the plurality of first partial regions being of the first conductivity type, the plurality of second partial regions being of the second conductivity type, the plurality of first partial regions and the plurality of second partial regions being provided alternately in a direction crossing the first direction,
    a portion of the first semiconductor region is between the first gate and the fourth semiconductor region in the first direction,
    a direction from the first gate toward the third semiconductor region is aligned with a second direction crossing the first direction,
    an other portion of the first semiconductor region is between the conductive portion and the fourth semiconductor region in the first direction,
    a direction from the conductive portion toward the third semiconductor region is aligned with the second direction,
    the first insulating region is provided between the first gate and the semiconductor portion and between the first gate and the first emitter, and
    the second insulating region is provided between the conductive portion and the semiconductor portion and between the conductive portion and the first emitter.

5. The control circuit according to claim 1, further comprising:
    a first resistance electrically connected to the first gate; and
    a second resistance electrically connected to the first gate, the second resistance being lower than the first resistance,
    in the first operation, the control circuit is electrically connected to the first gate via the first resistance, and
    in the second operation, the control circuit is electrically connected to the first gate via the second resistance.

6. The control circuit according to claim 5, wherein
the control circuit includes:
a controller;
a first switch provided in a path between the controller and the first resistance; and
a second switch provided in a path between the controller and the second resistance.

7. The control circuit according to claim 1, wherein
the control circuit further includes a second element, the second element including a second gate, a second collector, and a second emitter,
the first emitter is electrically connected to the second collector, and
in the first operation and the second operation, the control circuit sets the second element to an OFF-state.

8. The control circuit according to claim 7, wherein the second element is an RC-IGBT.

9. The control circuit according to claim 7, wherein
the second element includes:
a semiconductor portion of the second element;
a conductive portion of the second element;
a first insulating region of the second element; and
a second insulating region of the second element,
the semiconductor portion of the second element includes:
a first semiconductor region of the second element provided between the second collector and the second emitter in a first direction of the second element, the first direction of the second element being from the second collector toward the second emitter, the first semiconductor region of the second element being of a first conductivity type;
a second semiconductor region of the second element electrically connected to the second emitter, the second semiconductor region of the second element being of the first conductivity type;
a third semiconductor region of the second element, the third semiconductor region of the second element being of a second conductivity type, a portion of the third semiconductor region of the second element being provided between the first semiconductor region of the second element and the second semiconductor region of the second element in the first direction of the second element;
a fourth semiconductor region of the second element provided between the second collector and the first semiconductor region of the second element, the fourth semiconductor region of the second element including a plurality of first partial regions of the second element and a plurality of second partial regions of the second element, the plurality of first partial regions of the second element being of the first conductivity type, the plurality of second partial regions of the second element being of the second conductivity type, the plurality of first partial regions of the second element and the plurality of second partial regions of the second element being provided alternately in a direction crossing the first direction of the second element,
a portion of the first semiconductor region of the second element is between the second gate and the fourth semiconductor region of the second element in the first direction of the second element,
a direction from the second gate toward the third semiconductor region of the second element is aligned with a second direction of the second element crossing the first direction of the second element,
an other portion of the first semiconductor region of the second element is between the conductive portion of the second element and the fourth semiconductor region of the second element in the first direction of the second element,
a direction from the conductive portion of the second element toward the third semiconductor region of the second element is aligned with the second direction of the second element,
the first insulating region of the second element is provided between the semiconductor portion and the second gate and the second element and between the second gate and the second emitter, and
the second insulating region of the second element is provided between the conductive portion of the second element and the semiconductor portion of the second element and between the second emitter and the conductive portion of the second element.

10. The control circuit according to claim 7, wherein
the control circuit further performs a third operation and a fourth operation,
in at least a portion of the third operation, the control circuit causes a third current to flow from the second emitter toward the second collector,
in at least a portion of the fourth operation, the control circuit causes a fourth current to flow from the second collector toward the second emitter, and
a third time constant of a switching of the second element in the third operation is shorter than a fourth time constant of a switching of the second element in the fourth operation.

11. The control circuit according to claim 10,
further comprising:
a first resistance electrically connected to the first gate;
a second resistance electrically connected to the first gate, the second resistance being lower than the first resistance;
a third resistance electrically connected to the second gate; and
a fourth resistance electrically connected to the second gate, the fourth resistance being lower than the third resistance,
in the first operation, the control circuit is connected to the first gate via the first resistance,
in the second operation, the control circuit is connected to the first gate via the second resistance,
in the third operation, the control circuit is connected to the second gate via the fourth resistance, and
in the fourth operation, the control circuit is connected to the second gate via the third resistance.

12. The control circuit according to claim 7, wherein
the first element and the second element are included in a set, and
the control circuit includes a plurality of the sets.

13. The control circuit according to claim 1,
further comprising:
a second element including a second gate, a second collector, and a second emitter;
a third element including a third gate, a third collector, and a third emitter; and
a fourth element including a fourth gate, a fourth collector, and a fourth emitter,
the first emitter is electrically connected to the second collector,
the first collector is electrically connected to the third collector, the first emitter is electrically connected also to a first end portion of a load, the third emitter is electrically connected to the fourth collector and a second end portion of the load, the second emitter is electrically connected to the fourth emitter, the control circuit performs at least a first polar operation and a second polar operation, the first polar operation repeating the first operation and a third operation, the second polar operation repeating the second operation and a fourth operation, in at least a portion of the first operation, the control circuit sets the second element and the third element to an OFF-state and causes the first current to flow in a first path, the first path being from the first collector toward the first emitter, from the first end portion toward the second end portion, and from the fourth collector toward the fourth emitter, in at least a portion of the second operation, the control circuit sets the second element and the third element to an OFF-state and causes the second current to flow in a second path, the second path being from the fourth emitter toward the fourth collector, from the second end portion toward the first end portion, and from the first emitter toward the first collector, in at least a portion of the third operation, the control circuit sets the first element and the fourth element to an OFF-state and causes a third current to flow in a third path, the third path being from the second emitter toward the second collector, from the first end portion toward the second end portion, and from the third emitter toward the third collector, in at least a portion of the fourth operation, the control circuit sets the first element and the fourth element to an OFF-state and causes a fourth current to flow in a fourth path, the fourth path being from the third collector toward the third emitter, from the second end portion toward the first end portion, and from the second collector toward the second emitter, a third time constant of a switching of the second element in the fourth operation is different from a fourth time constant of a switching of the second element in the third operation, a fifth time constant of a switching of the third element in the fourth operation is different from a sixth time constant of a switching of the third element in the third operation, and a seventh time constant of a switching of the fourth element in the first operation is different from an eighth time constant of a switching of the fourth element in the second operation.

14. The control circuit according to claim 13, wherein the fourth time constant is shorter than the third time constant, the sixth time constant is shorter than the fifth time constant, and the eighth time constant is shorter than the seventh time constant.

15. The control circuit according to claim 13, wherein the second element, the third element, and the fourth element are RC-IGBTs.

16. The control circuit according to claim 13, wherein the second element includes:
 a semiconductor portion of the second element;
 a conductive portion of the second element;
 a first insulating region of the second element; and
 a second insulating region of the second element, the semiconductor portion of the second element includes:
 a first semiconductor region of the second element provided between the second collector and the second emitter in a first direction of the second element, the first direction of the second element being from the second collector toward the second emitter, the first semiconductor region of the second element being of a first conductivity type;
 a second semiconductor region of the second element electrically connected to the second emitter, the second semiconductor region of the second element being of the first conductivity type;
 a third semiconductor region of the second element, the third semiconductor region of the second element being of a second conductivity type, a portion of the third semiconductor region of the second element being provided between the first semiconductor region of the second element and the second semiconductor region of the second element in the first direction of the second element;
 a fourth semiconductor region of the second element provided between the second collector and the first semiconductor region of the second element, the fourth semiconductor region of the second element including a plurality of first partial regions of the second element and a plurality of second partial regions of the second element, the plurality of first partial regions of the second element being of the first conductivity type, the plurality of second partial regions of the second element being of the second conductivity type, the plurality of first partial regions of the second element and the plurality of second partial regions of the second element being provided alternately in a direction crossing the first direction of the second element, a portion of the first semiconductor region of the second element is between the second gate and the fourth semiconductor region of the second element in the first direction of the second element, a direction from the second gate toward the third semiconductor region of the second element is aligned with a second direction of the second element crossing the first direction of the second element, an other portion of the first semiconductor region of the second element is between the conductive portion of the second element and the fourth semiconductor region of the second element in the first direction of the second element, a direction from the conductive portion of the second element toward the third semiconductor region of the second element is aligned with the second direction of the second element, the first insulating region of the second element is provided between the second gate and the semiconductor portion of the second element and between the second gate and the second emitter, the second insulating region of the second element is provided between the conductive portion of the second element and the semiconductor portion of the second element and between the second emitter and the conductive portion of the second element, the third element includes:
 a semiconductor portion of the third element;
 a conductive portion of the third element;
 a first insulating region of the third element; and
 a second insulating region of the third element, the semiconductor portion of the third element includes:
  a first semiconductor region of the third element provided between the third collector and the third emitter in a first direction of the third element, the first direction of the third element being from the third collector toward the third emitter, the first semiconductor region of the third element being of a first conductivity type;
  a second semiconductor region of the third element electrically connected to the third emitter, the second semiconductor region of the third element being of the first conductivity type;
  a third semiconductor region of the third element, the third semiconductor region of the third element being of a second conductivity type, a portion of the third semiconductor region of the third element being provided between the first semiconductor region of the third element and the second semiconductor region of the third element in the first direction of the third element; and
  a fourth semiconductor region of the third element provided between the third collector and the first semiconductor region of the third element, the fourth semiconductor region of the third element including a plurality of first partial regions of the third element and a plurality of second partial regions of the third element, the plurality of first partial regions of the third element being of the first conductivity type, the plurality of second partial regions of the third element being of the second conductivity type, the plurality of first partial regions of the third element and the plurality of second partial regions of the third element being provided alternately in a direction crossing the first direction of the third element,
a portion of the first semiconductor region of the third element is between the third gate and the fourth semiconductor region of the third element in the first direction of the third element,
a direction from the third gate toward the third semiconductor region of the third element is aligned with a second direction of the third element crossing the first direction of the third element,
an other portion of the first semiconductor region of the third element is between the conductive portion of the third element and the fourth semiconductor region of the third element in the first direction of the third element,
a direction from the conductive portion of the third element toward the third semiconductor region of the third element is aligned with the second direction of the third element,
the first insulating region of the third element is provided between the third gate and the semiconductor portion of the third element and between the third gate and the third emitter,
the second insulating region of the third element is provided between the conductive portion of the third element and the semiconductor portion of the third element and between the third emitter and the conductive portion of the third element,
the fourth element includes:
  a semiconductor portion of the fourth element;
  a conductive portion of the fourth element;
  a first insulating region of the fourth element; and
  a second insulating region of the fourth element, the semiconductor portion of the fourth element includes:
  a first semiconductor region of the fourth element provided between the fourth collector and the fourth emitter in a first direction of the fourth element, the first direction of the fourth element being from the fourth collector toward the fourth emitter, the first semiconductor region of the fourth element being of a first conductivity type;
  a second semiconductor region of the fourth element electrically connected to the fourth emitter, the second semiconductor region of the fourth element being of the first conductivity type;
  a third semiconductor region of the fourth element, the third semiconductor region of the fourth element being of a second conductivity type, a portion of the third semiconductor region of the fourth element being provided between the first semiconductor region of the fourth element and the second semiconductor region of the fourth element in the first direction of the fourth element; and
  a fourth semiconductor region of the fourth element provided between the fourth collector and the first semiconductor region of the fourth element, the fourth semiconductor region of the fourth element including a plurality of first partial regions of the fourth element and a plurality of second partial regions of the fourth element, the plurality of first partial regions of the fourth element being of the first conductivity type, the plurality of second partial regions of the fourth element being of the second conductivity type, the plurality of first partial regions of the fourth element and the plurality of second partial regions of the fourth element being provided alternately in a direction crossing the first direction of the fourth element,
a portion of the first semiconductor region of the fourth element is between the fourth gate and the fourth semiconductor region of the fourth element in the first direction of the fourth element,
a direction from the fourth gate toward the third semiconductor region of the fourth element is aligned with a second direction of the fourth element crossing the first direction of the fourth element,
an other portion of the first semiconductor region of the fourth element is between the conductive portion of the fourth element and the fourth semiconductor region of the fourth element in the first direction of the fourth element,
a direction from the conductive portion of the fourth element toward the third semiconductor region of the fourth element is aligned with the second direction of the fourth element,
the first insulating region of the fourth element is provided between the fourth gate and the semiconductor portion of the fourth element and between the fourth gate and the fourth emitter, and
the second insulating region of the fourth element is provided between the conductive portion of the fourth element and the semiconductor portion of the fourth element and between the fourth emitter and the conductive portion of the fourth element.

17. The control circuit according to claim 13,
further comprising:
  a first resistance electrically connected to the first gate;
  a second resistance electrically connected to the first gate, the second resistance being lower than the first resistance;

a third resistance electrically connected to the second gate;

a fourth resistance electrically connected to the second gate, the fourth resistance being lower than the third resistance;

a fifth resistance electrically connected to the third gate;

a sixth resistance electrically connected to the third gate, the sixth resistance being lower than the fifth resistance;

a seventh resistance electrically connected to the fourth gate; and an eighth resistance electrically connected to the fourth gate, the eighth resistance being lower than the seventh resistance, in the first operation, the control circuit is electrically connected to the first gate via the first resistance and electrically connected to the fourth gate via the seventh resistance, in the second operation, the control circuit is electrically connected to the first gate via the second resistance and electrically connected to the fourth gate via the eighth resistance, in the third operation, the control circuit is electrically connected to the second gate via the fourth resistance and electrically connected to the third gate via the sixth resistance, and in the fourth operation, the control circuit is electrically connected to the second gate via the third resistance and electrically connected to the third gate via the fifth resistance.

18. An electrical circuit device, comprising:

the control circuit according to claim 1; and a semiconductor device.

* * * * *